(12) United States Patent
Gale

(10) Patent No.: US 7,816,925 B1
(45) Date of Patent: Oct. 19, 2010

(54) ELECTRICAL CONTINUITY TESTER AND TRACER

(76) Inventor: Robert D. Gale, P.O. Box 417280, Sacramento, CA (US) 95841

( * ) Notice: Subject to any disclaimer, the term of this patent is extended or adjusted under 35 U.S.C. 154(b) by 202 days.

(21) Appl. No.: 12/213,585

(22) Filed: Jun. 20, 2008

Related U.S. Application Data

(60) Provisional application No. 60/945,140, filed on Jun. 20, 2007.

(51) Int. Cl.
*G01R 31/02* (2006.01)
(52) U.S. Cl. ..................... 324/555; 324/543
(58) Field of Classification Search ............. 324/555, 324/508, 542, 66, 67, 133
See application file for complete search history.

(56) References Cited

U.S. PATENT DOCUMENTS 4,864,225 A * 9/1989 Long et al. .................. 324/133
5,477,152 A * 12/1995 Hayhurst ..................... 324/542
6,437,580 B1 8/2002 Gale
7,375,533 B2 5/2008 Gale

* cited by examiner

*Primary Examiner*—Vincent Q Nguyen
(74) *Attorney, Agent, or Firm*—Shlesinger, Arkwright & Garvey LLP

(57) ABSTRACT

An electrical continuity tester for testing the continuity of a cable between one end to another end, includes a main housing having first and second ends; a first test port disposed at the first end, the first test port for being connected to one end of a cable being tested; a circuit disposed within the main body operably connected to the first test port, the circuit including a first indicator for indicating the continuity of a cable being tested; a coupler removably secured to the main housing; and a terminator removably secured to the coupler, the terminator for connecting to another end of a cable being tested, the terminator including a second indicator for indicating the continuity of the cable being tested when the first test port is connected to the one end of the cable.

44 Claims, 39 Drawing Sheets

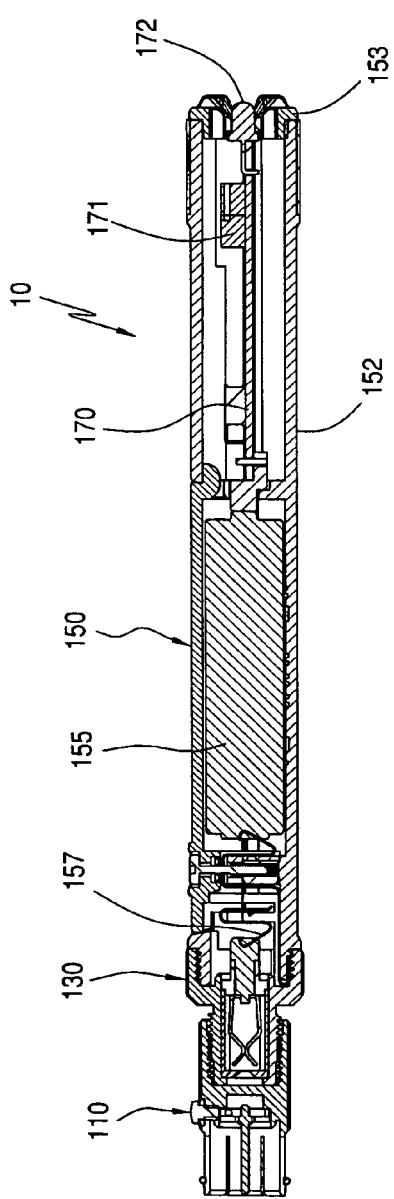
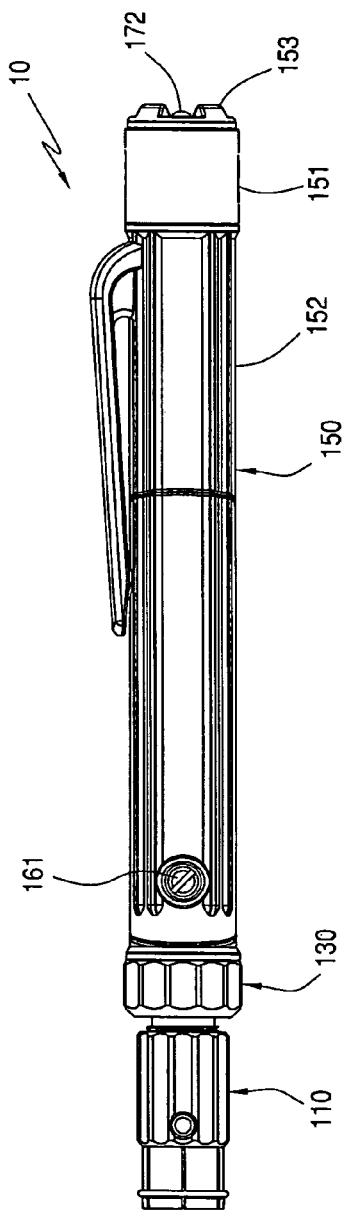
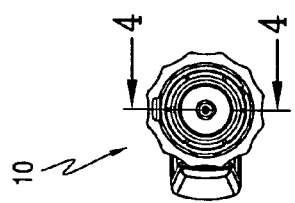
FIG. 4
FIG. 3
FIG. 2

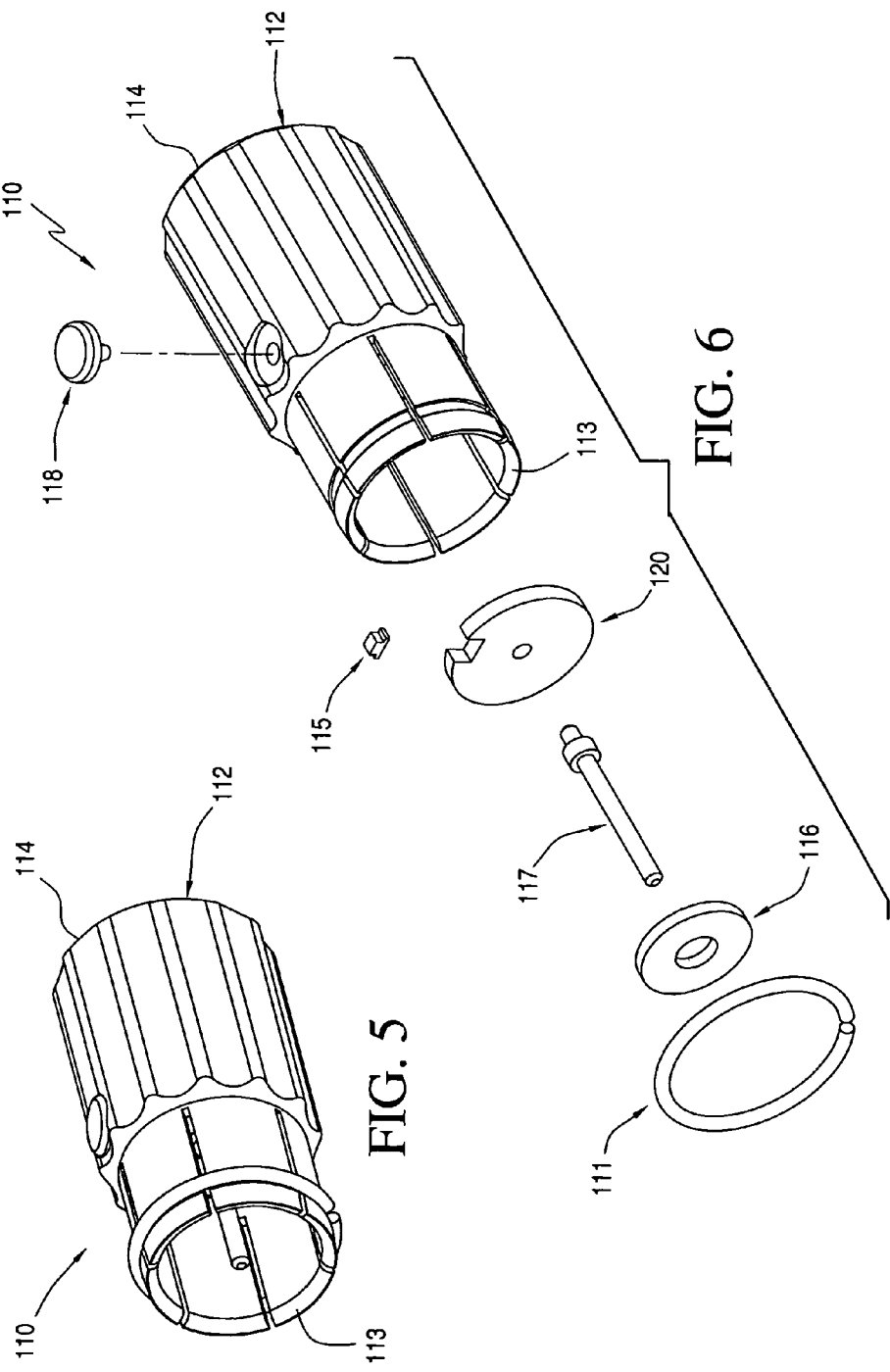

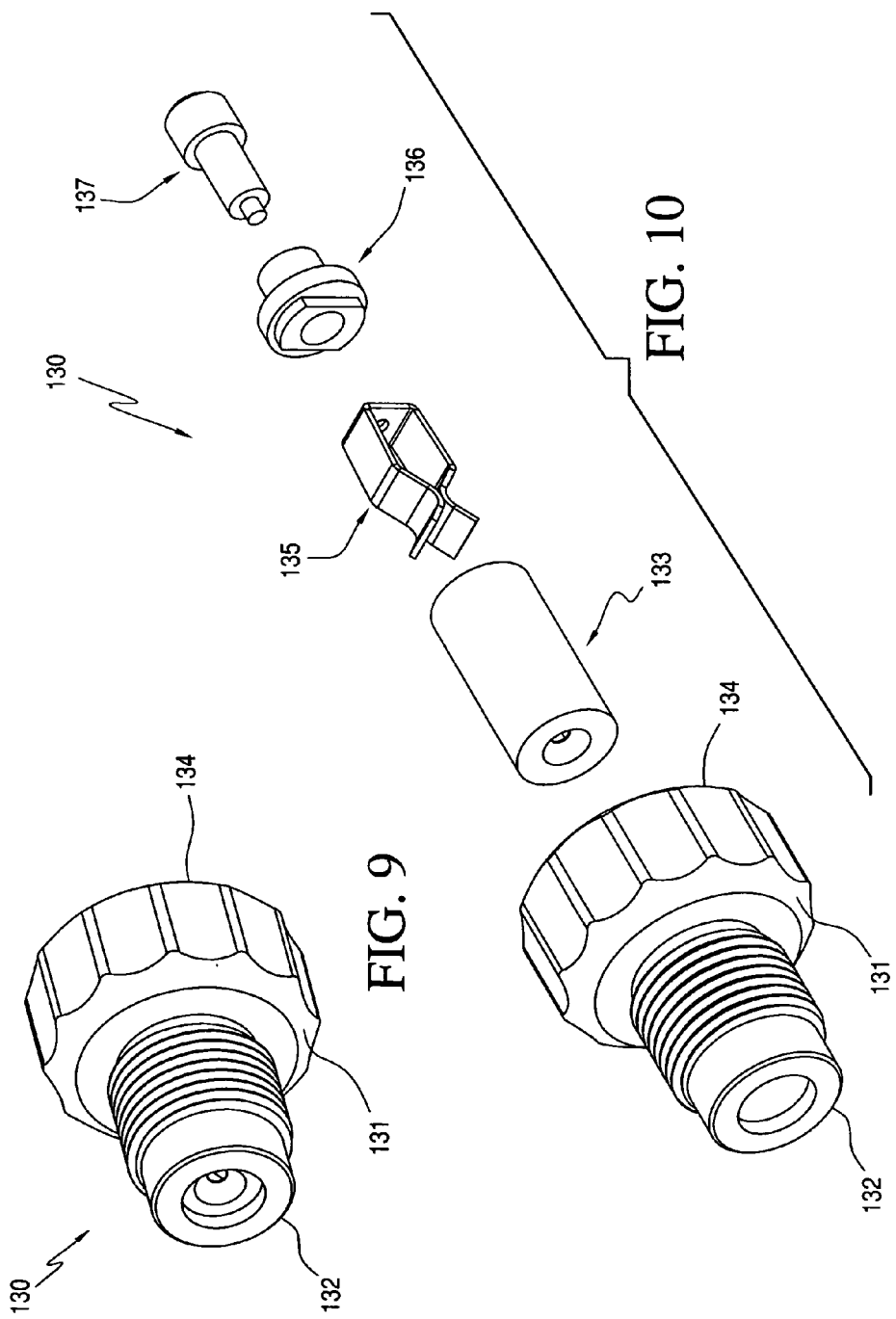

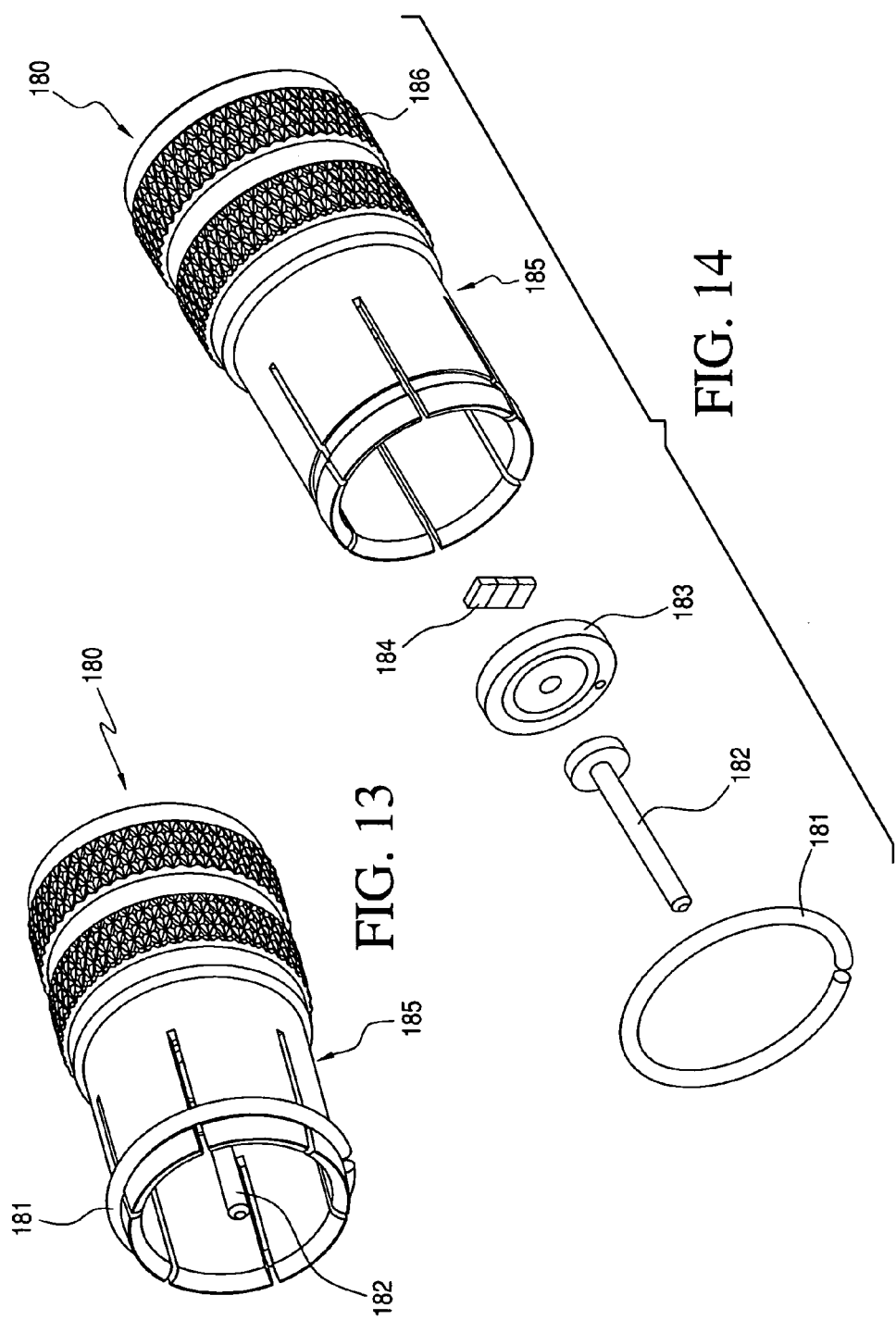

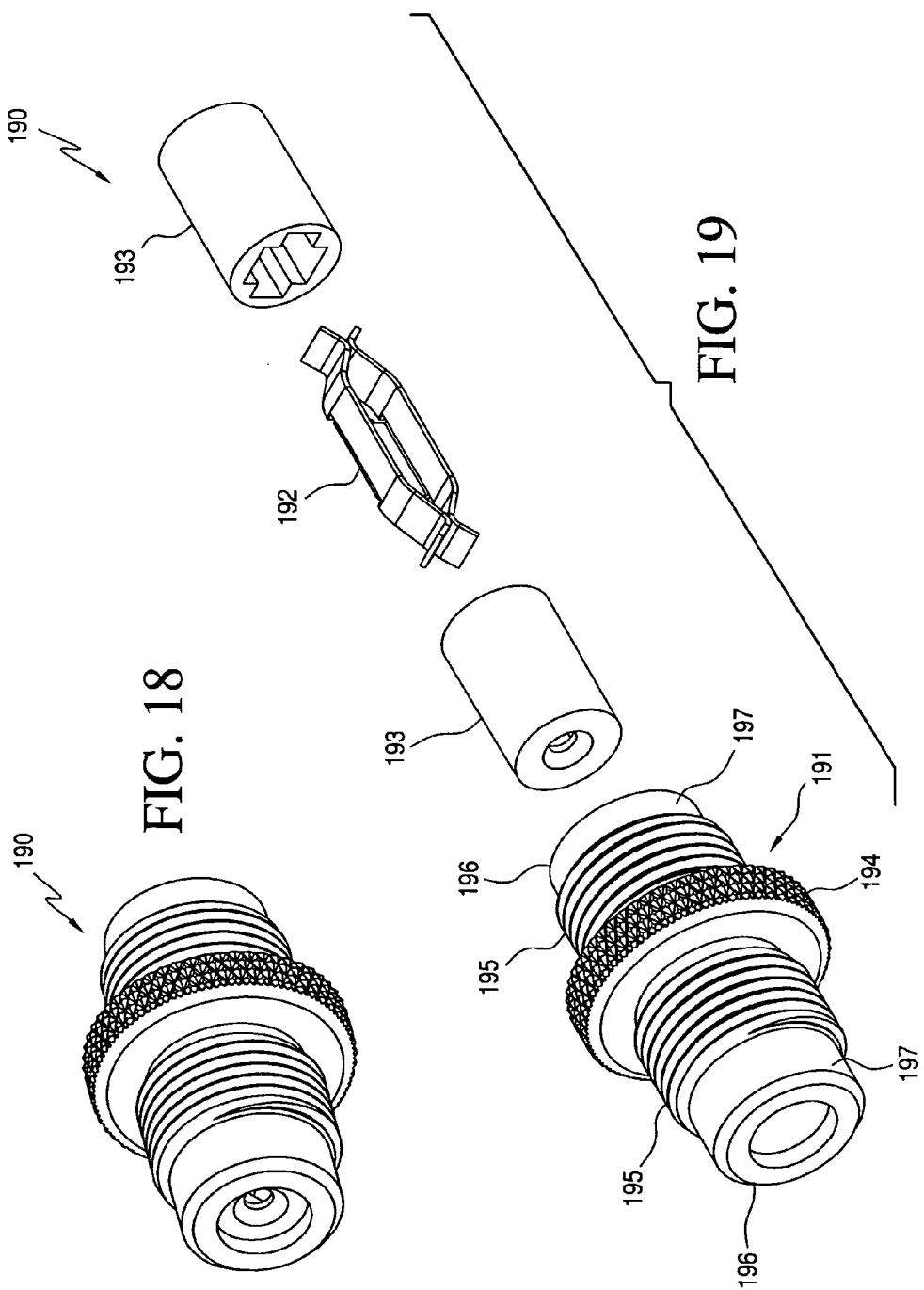

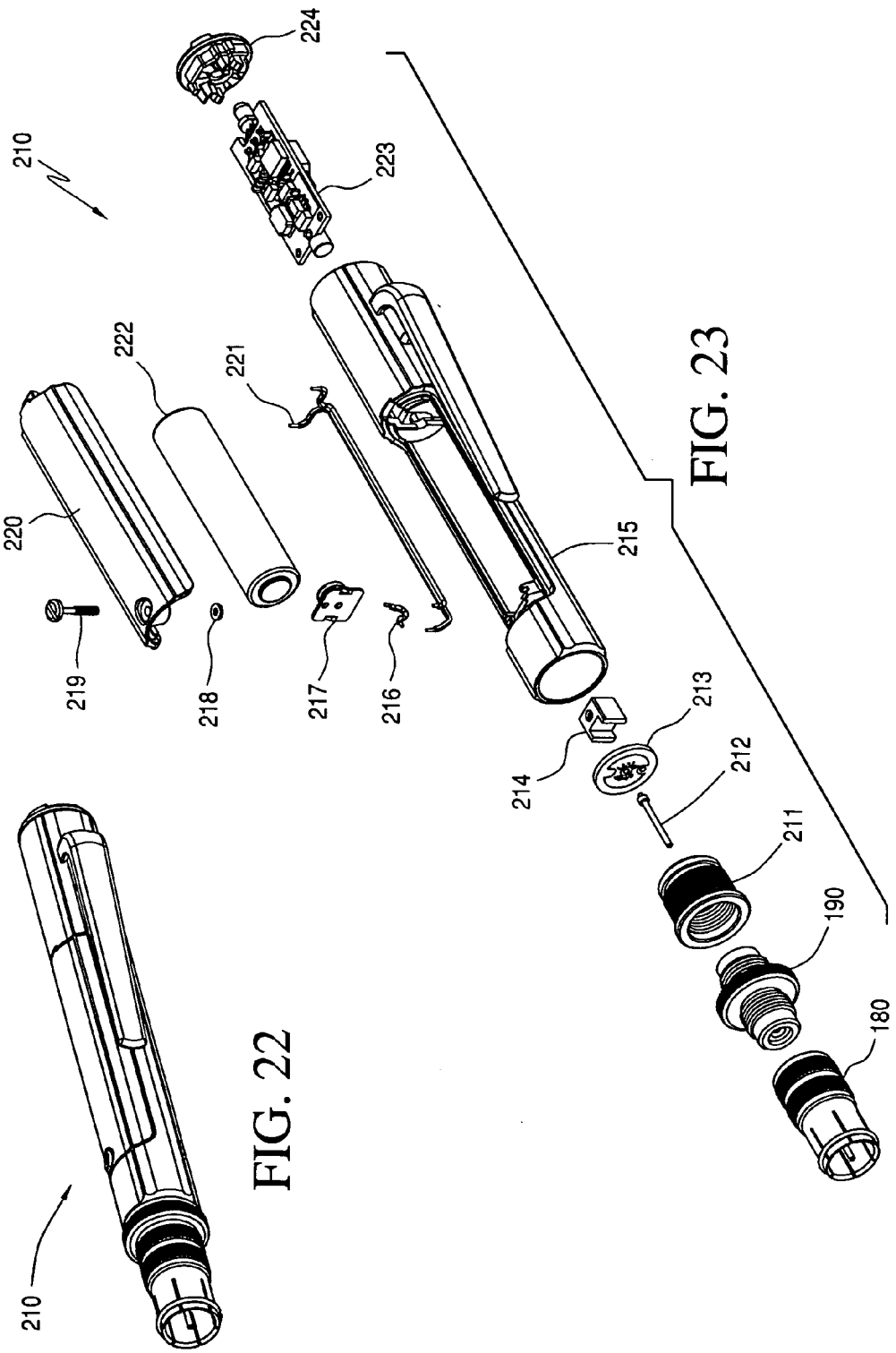

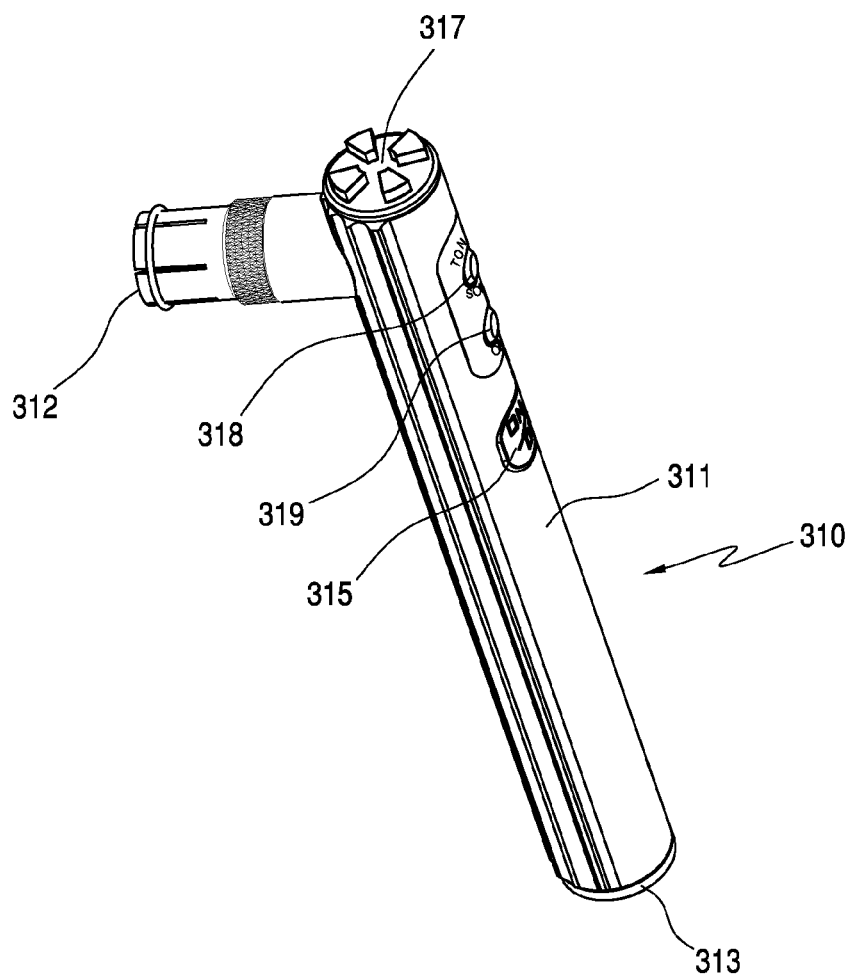
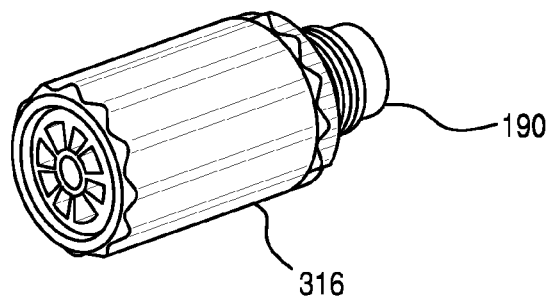
FIG. 28

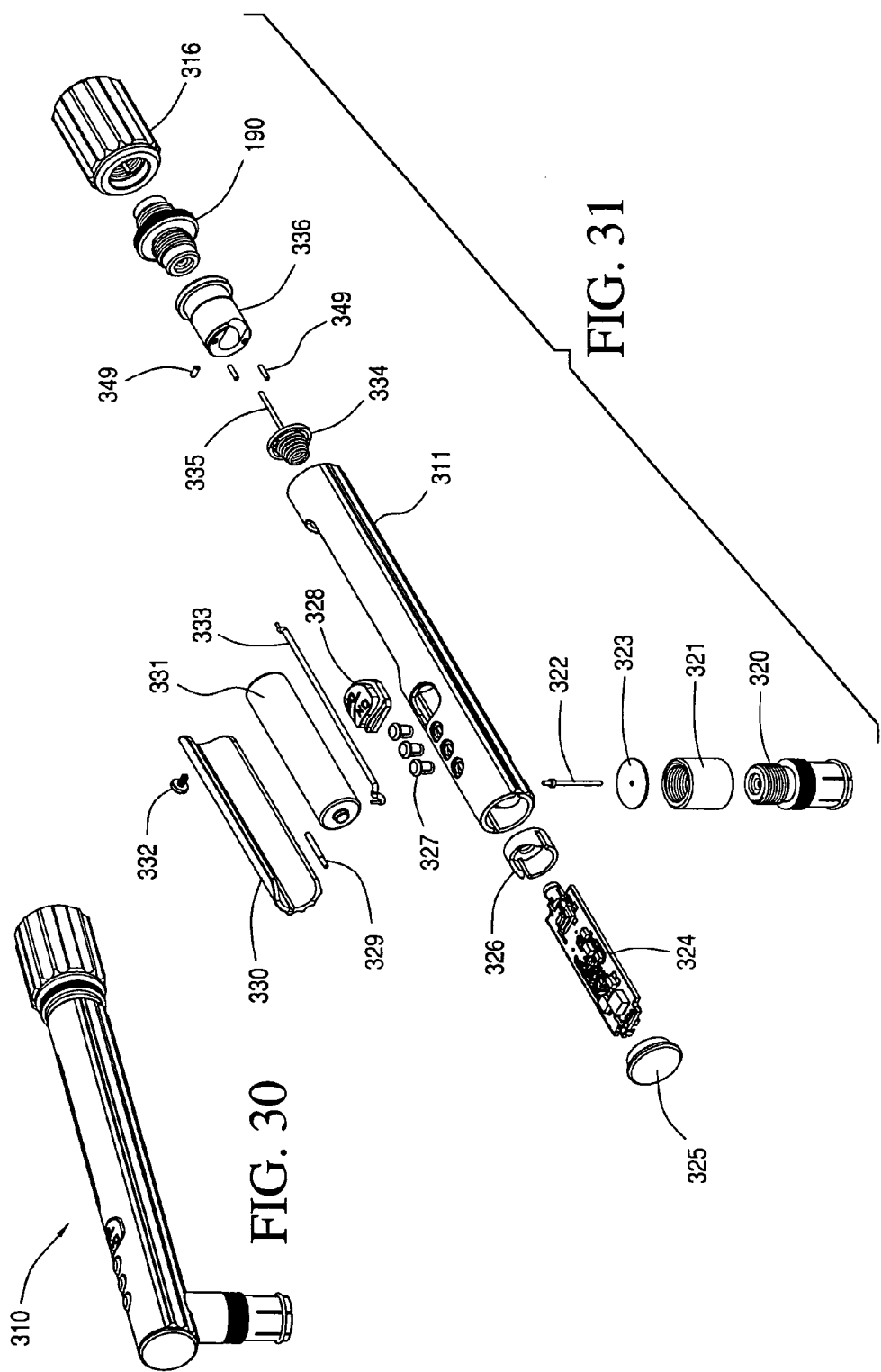

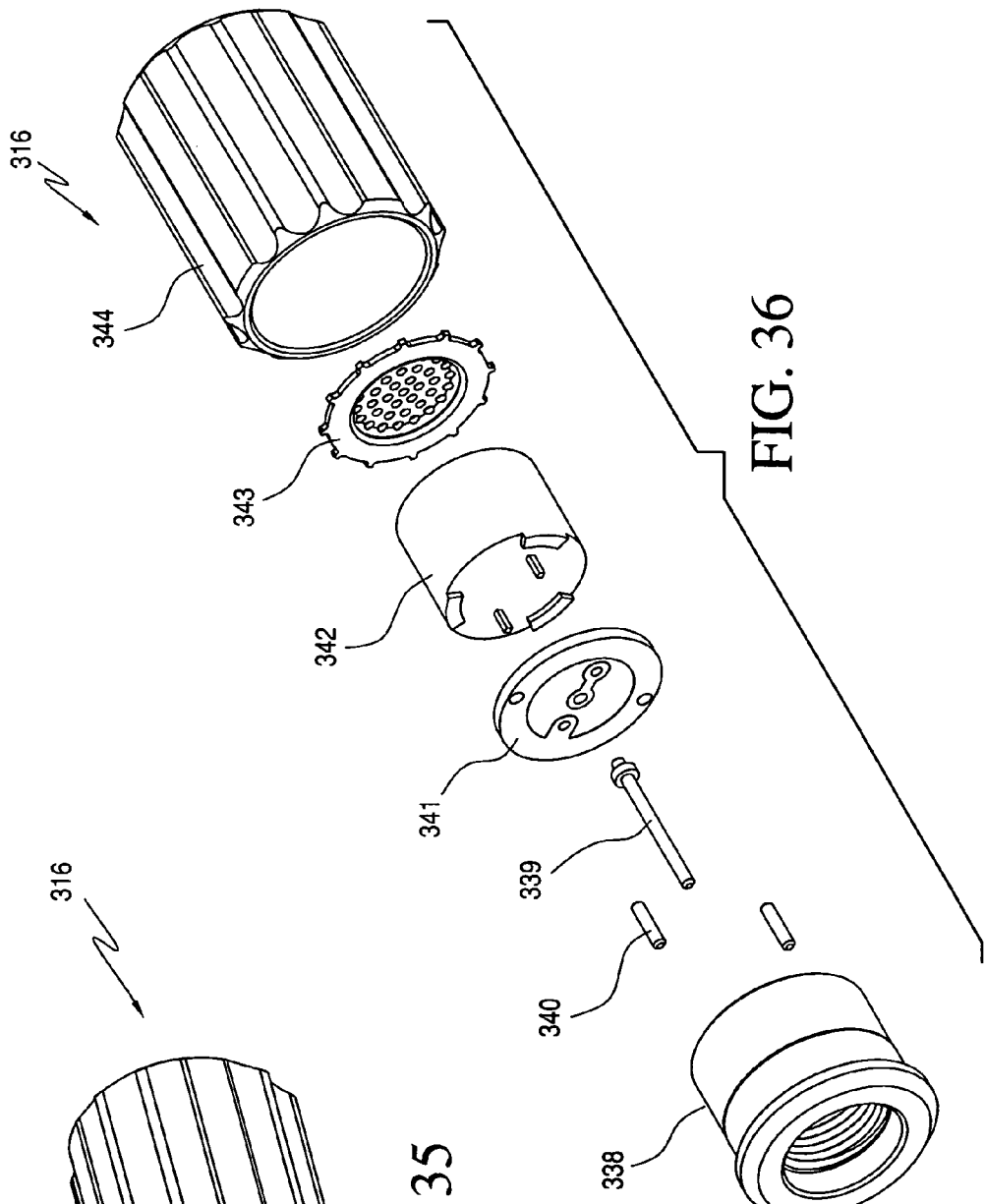

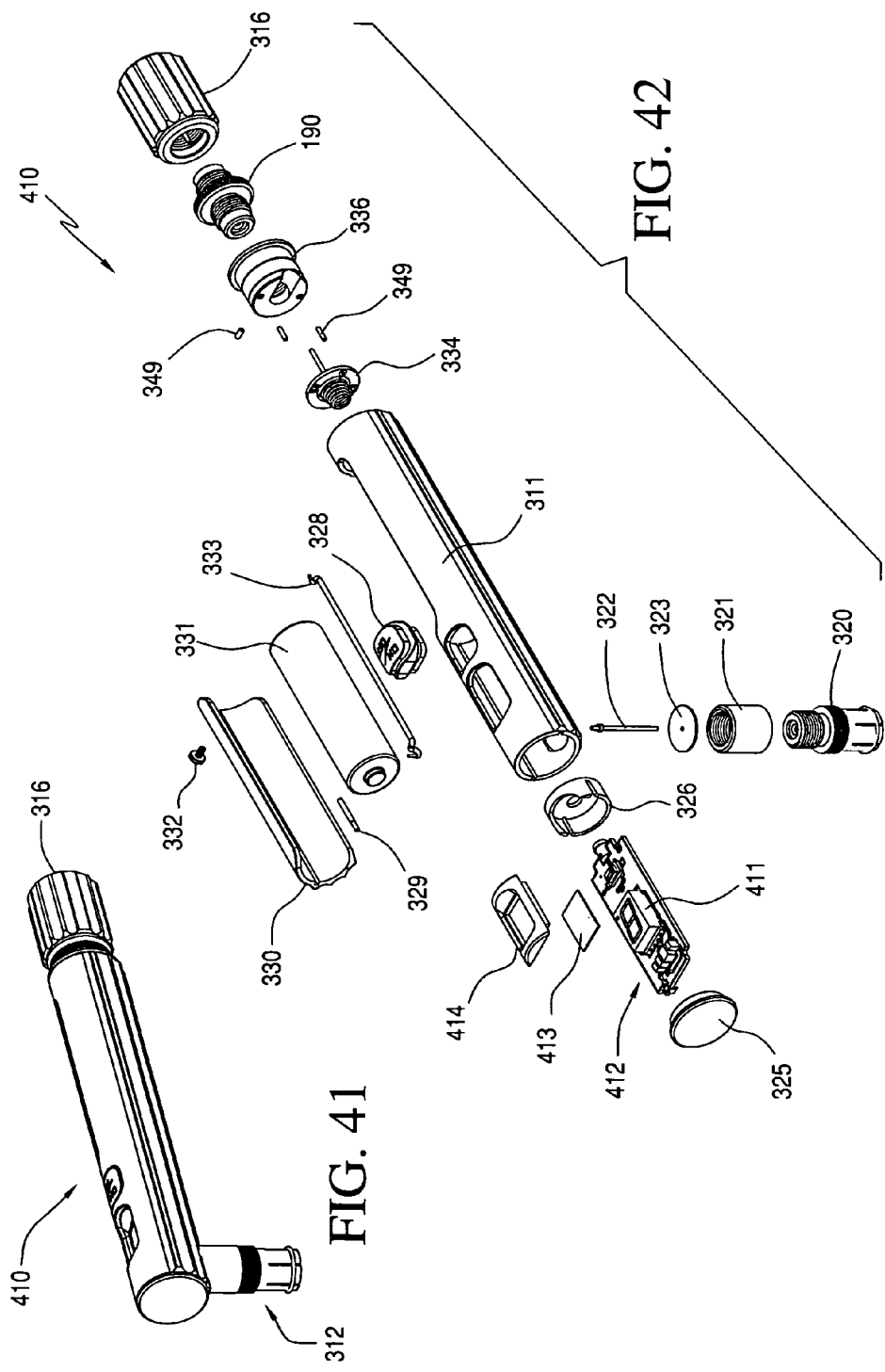

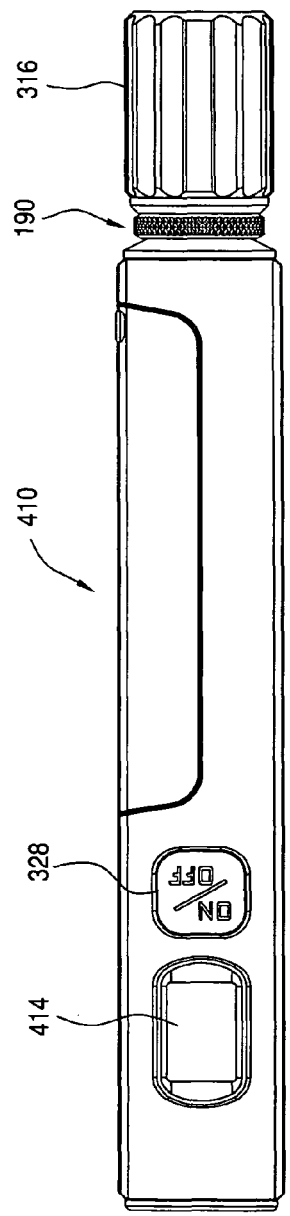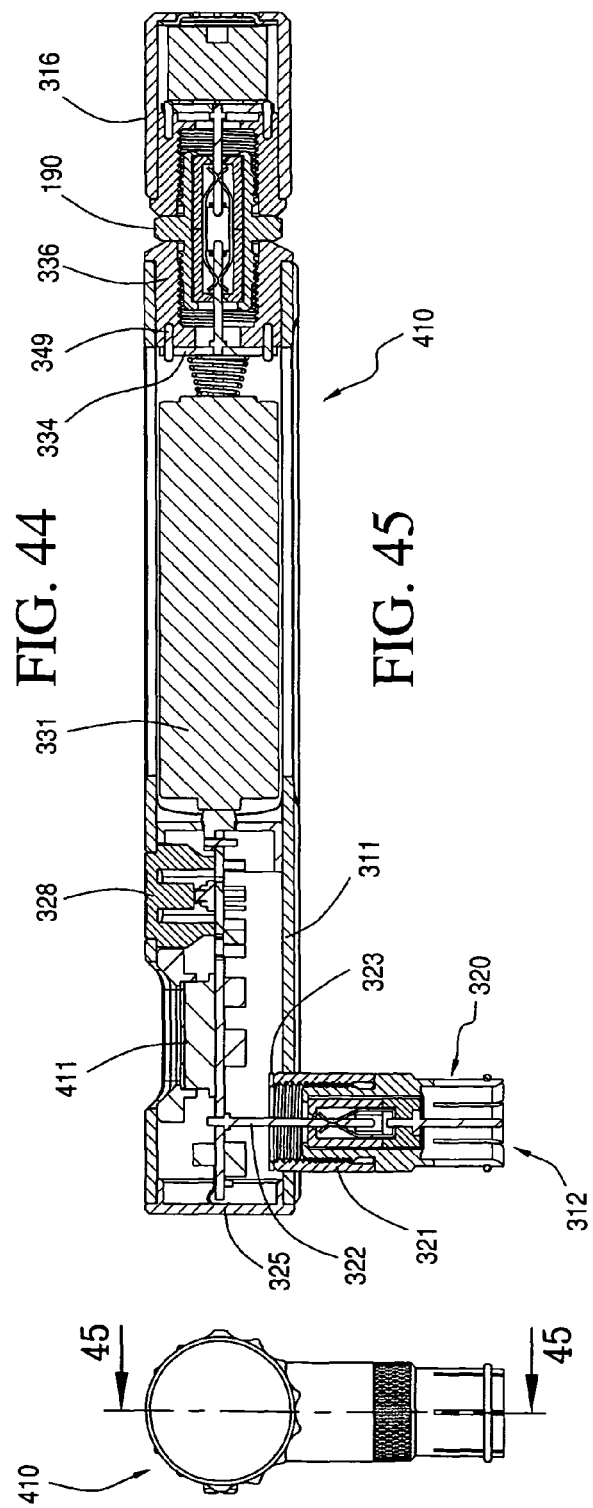

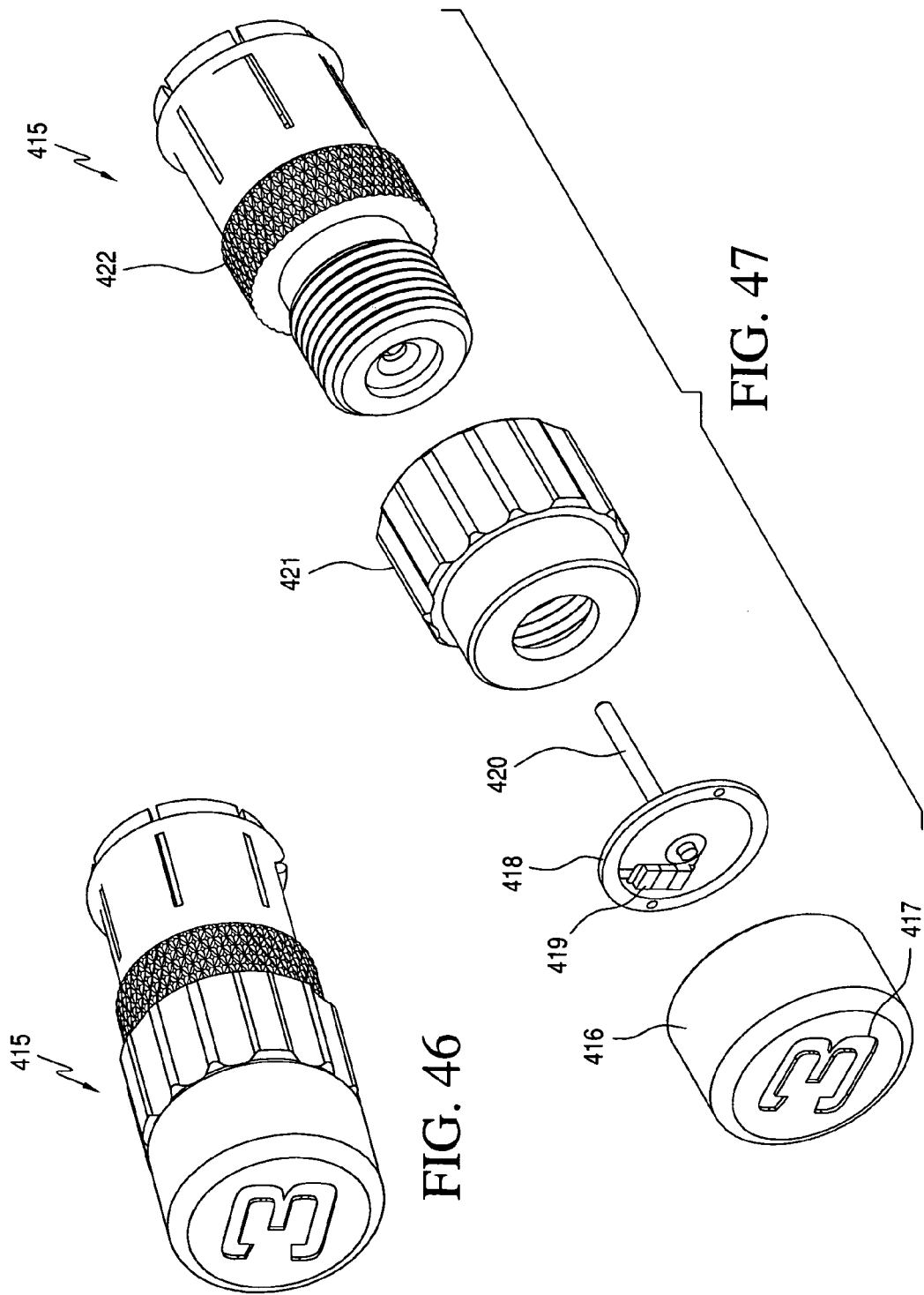

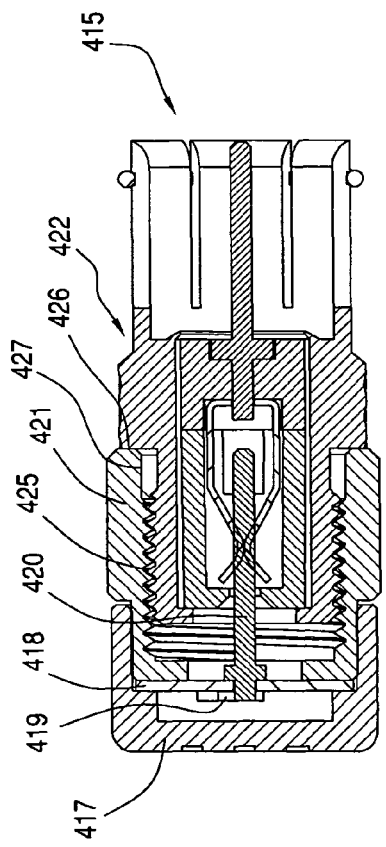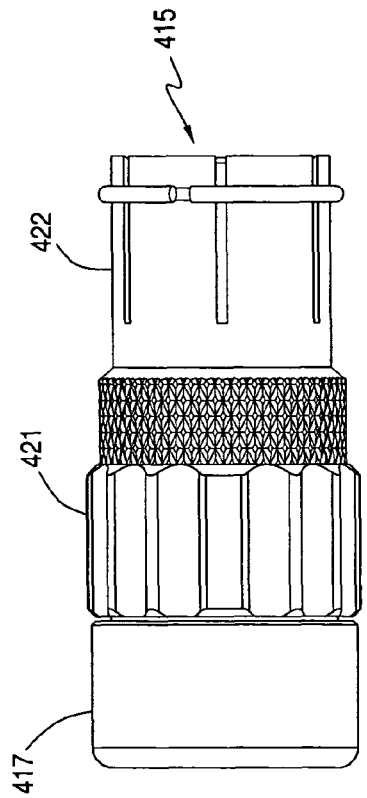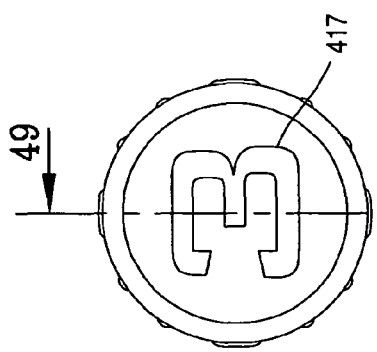
FIG. 49
FIG. 50
FIG. 48

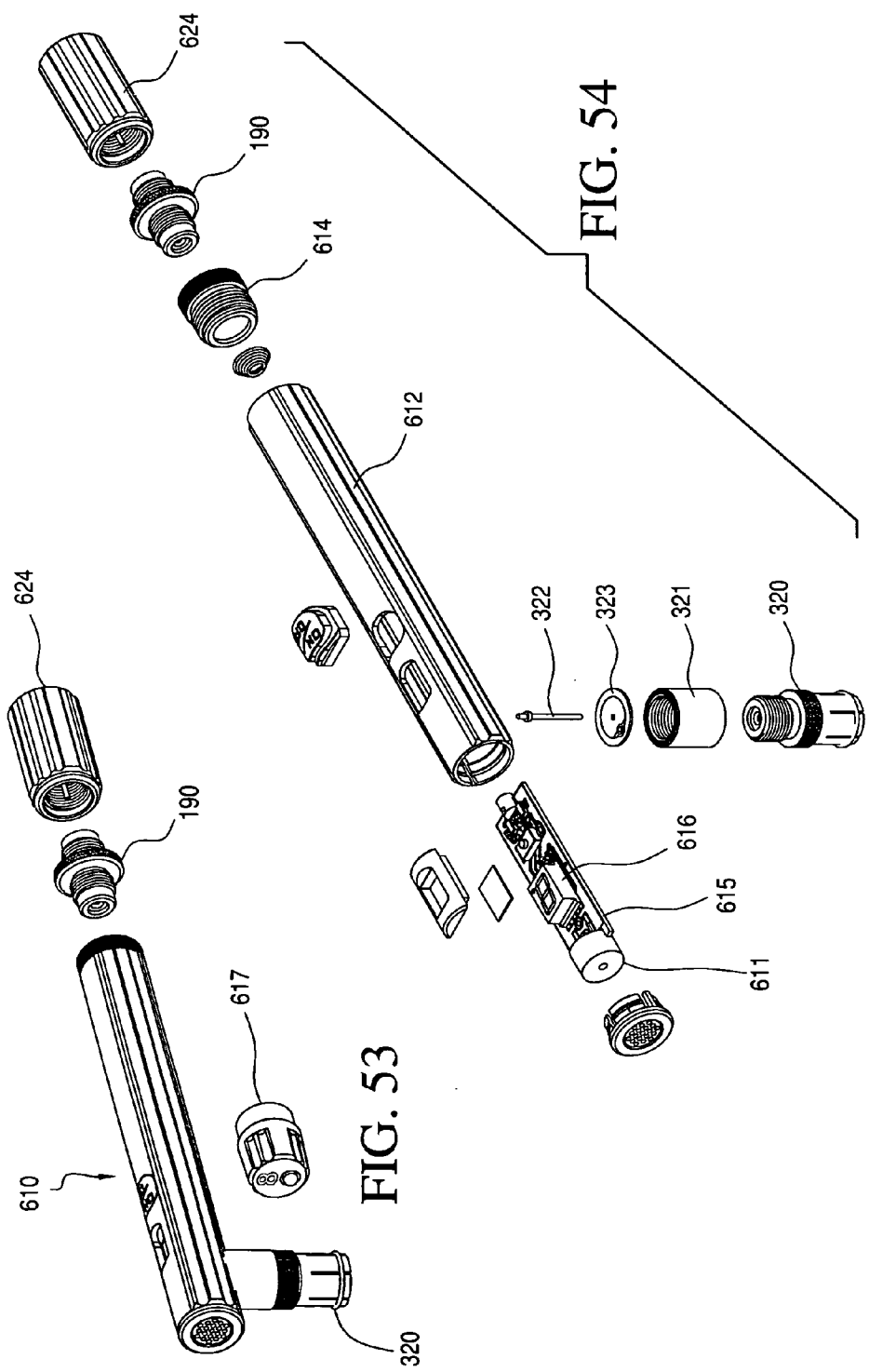

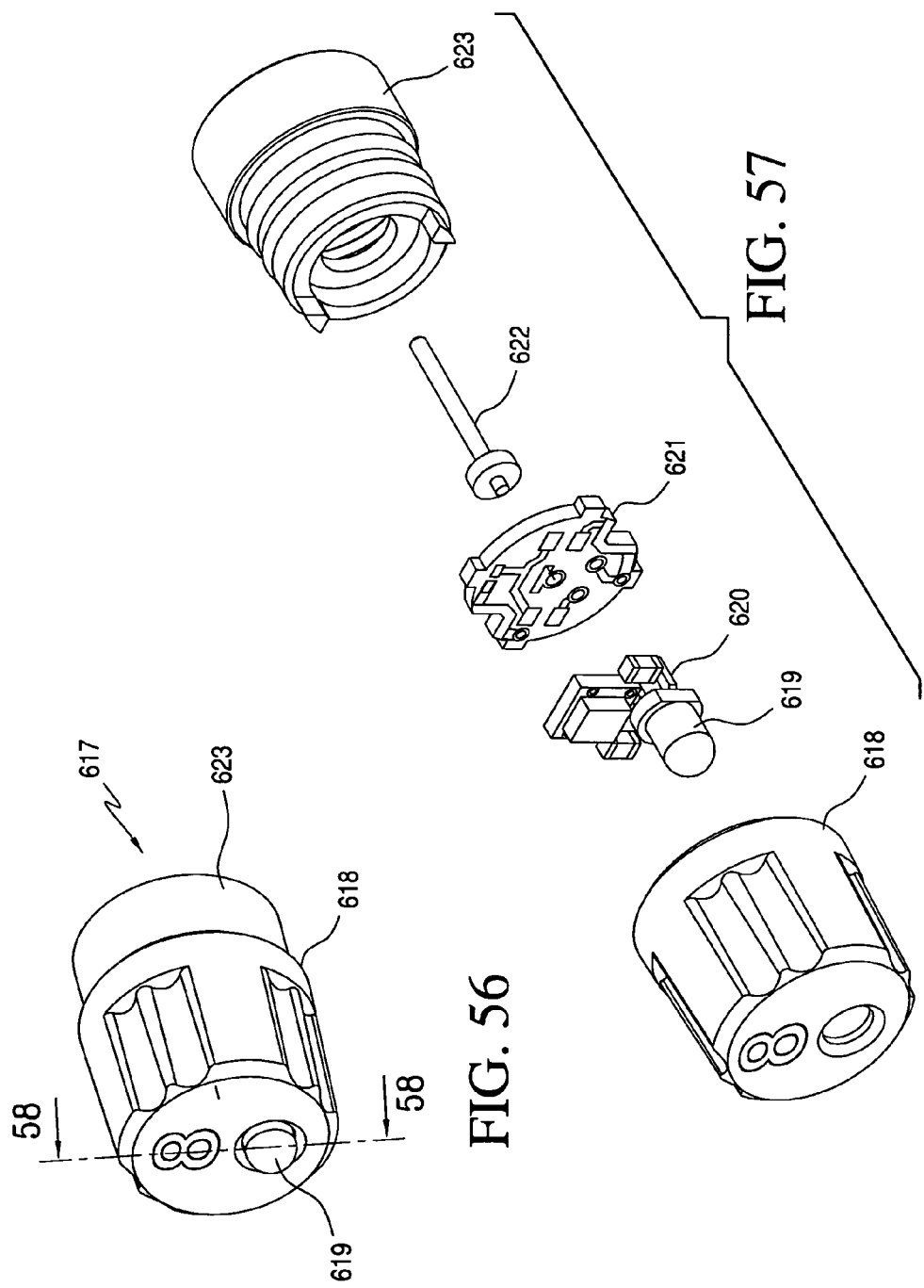

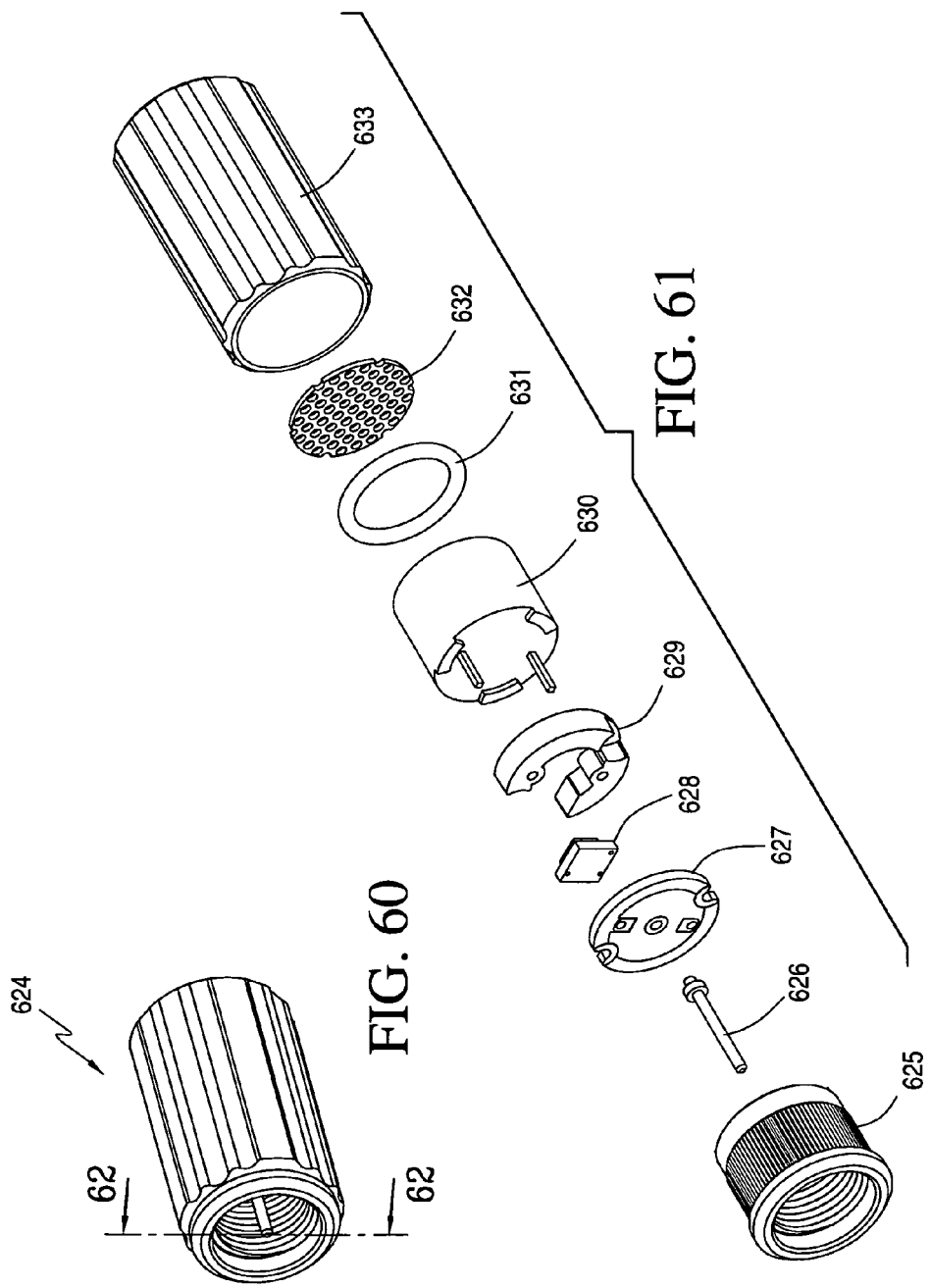

FIG. 67

Pocket Toner Devices 310, 410, 510, and 610

| Item | Component value | Qty | References | Manufacturer | Manufacturer P/N |
|---|---|---|---|---|---|
| 1 | PCB | 1 | | Gale Corp | 07-072 |
| 2 | BUZZER | 1 | BZ1 | Dongson | DSTB-9255P-27-3 |
| 3 | CAP CER 4.7UF 10V X7R 0805 | 2 | C1 C2 | Generic | CAP CER 4.7UF 6.3V 20% X5R 0805 |
| 4 | CAP CER 0.1UF 16V X7R 0603 | 2 | C3 C4 | Generic | CAP CER 100NF 16V 10% X7R 0603 |
| 5 | MBRX02520 Schottky Diode | 1 | D3 | Micro Comm | MBRX02520-TP |
| 6 | 7SEG LED Display | 1 | D2 | SunLED | XZFMG07A |
| 7 | PT-SS-P-ANODE-CONTACT | 1 | J1 | Gale Corp | 07-092 |
| 8 | PTSSM-PCB-PIN | 1 | J1 | Gale Corp | 07-025 |
| 9 | 4.7 uH Inductor | 1 | L1 | SuperWorld | SD13225-4R7KF |
| 10 | POLYZEN Protection Diode | 1 | PTC1 | Tyco | ZEN056V130A24LS |
| 11 | 2N7002 MOSFET, N-Ch | 1 | Q1 | Generic | 2N7002 |
| 12 | MMBT3904 Transistor, NPN | 1 | Q3 | Fairchild | MMBT3904 |
| 13 | FDN306P MOSFET, P-Ch | 1 | Q4 | Fairchild | FDN306P |
| 14 | 33, 1/8W Ω Resistor | 1 | R3 | Generic | RES 33 1% 0805 |
| 15 | 100 Ω Resistor | 1 | R6 | Generic | RES 100 1% 0603 |
| 16 | 160 Ω Resistor | 1 | R13 | Generic | RES 160 1% 0603 |
| 17 | 560 Ω Resistor | 2 | R9 R10 | Generic | RES 560 1% 0603 |
| 18 | 100K Ω Resistor | 2 | R4 R5 | Generic | RES 100K 1% 0603 |
| 19 | 499K Ω Resistor | 3 | R2 R14 R15 | Generic | RES 499K 1% 0603 |
| 20 | 1.02M Ω Resistor | 1 | R1 | Generic | RES 1.02M 1% 0603 |
| 21 | PB SW, Push-button | 1 | S1 | Panasonic | EVQPPPA25 |
| 22 | LTC3400, Boost converter | 1 | U1 | Linear Technology | LTC3400ES6 |
| 23 | PIC16F616, Micro-controller | 1 | U2 | Microchip | PIC16F616-I/ST |

FIG. 68

ELECTRICAL CONTINUITY TESTER AND TRACER

RELATED APPLICATION

This is a nonprovisional application claiming the benefit of provisional application Ser. No. 60/945,140, filed on Jun. 20, 2007, which is hereby incorporated by reference.

BACKGROUND OF THE INVENTION

1. Field of Invention

The present invention is related to the field of devices for electronic testing and tracing of electrical circuits. More particularly, it relates to a device for identifying and testing the continuity of electrical wires, cables and cable networks.

2. Description of Related Art

Wire connectivity is essential to the proper function of telephone systems; cable television (CATV) systems; security systems; closed-circuit television (CCTV) systems; local and wide area computer networks (LANs and WANs); and, other multi-node, and multi-user systems. When a wire fault is encountered, the tracing of individual cables through wire bundles, and confirming their electrical continuity, often can be tedious and cause significant problems. Cables or wire are often not identified with corresponding tags, labels or color-coding at both ends, so technicians installing or testing pre-wired systems, or removing, repairing or re-routing the cables of an existing system, have to sort through and test each cable individually. This commonly entails sorting through a number of upstream wire ends at a junction box or panel, and testing each against individual downstream terminals where they connect to devices.

In the tracing of wires, in particular telephone and LAN type wires from its downstream terminus back to the junction box, a technician normally secures a short circuit or low-resistance wire terminator to the downstream terminus of the desired cable and then, back at the junction box, connects a volt-ohm meter (VOM) to each upstream wire end, one-by-one. All wires but the correct one will produce a substantially infinite resistance reading, while the desired cable will show continuity. If a standard 75-ohm terminator is used at the downstream terminal, a 75-ohm resistance reading on the meter confirms that no mid-wire short is present. Proceeding one-by-one through a great number of wire ends is a very tedious, laborious process. And, it is even more difficult and time-consuming if the technician desires to determine which of a multitude of downstream wire ends are associated with a particular upstream wire end at the junction box. In that case, the technician must either affix a terminator to the upstream end and walk room-to-room or workstation-to-workstation connecting a VOM to each downstream terminal, searching for continuity. Or, the technician must connect the VOM to the upstream end of the desired wire at the junction box and, repeatedly, walk to a downstream terminal; connect a terminator; and, walk back to the junction box to read the meter.

To aid technicians in trouble-shooting electrical wires and cables, various conventional devices have been used and proposed for more convenient testing and tracing of wire systems. Miniaturized, limited-purpose versions of VOMs having cables, probes, clips, adaptors, LED's, tone generators and streamlined cases are commonly available, but they are generally difficult to use among tangled masses of cable ends, and must be carried in a toolbox rather than in the technician's pocket. Accordingly, there is a need for an easily manipulable, easy to read device for testing and tracing of wire bundles. One such conventional device to perform the above mentioned type testing for coaxial cables is the Gale Cable continuity tester and tracer (Pocket Toner) of U.S. Pat. No. 6,437,580, which is incorporated herein by reference in its entirety.

Additionally, another deficiency with conventional continuity testers is that conventional continuity testers do not include a surge protector to protect the conventional continuity testers against over-voltage.

Accordingly, it appears there exists a need to adapt an easily manipulable, easy to read pocket continuity testing device for the testing and tracing continuity in multiple type of electrical circuits.

SUMMARY OF THE INVENTION

The present invention is an electrical continuity tester for testing the continuity of a cable between one end to another end, comprising a main housing having first and second ends; a first test port disposed at the first end, the first test port for being connected to one end of a cable being tested; a circuit disposed within the main body operably connected to the first test port, the circuit including a first indicator for indicating the continuity of a cable being tested; a coupler removably secured to the main housing; and a terminator removably secured to the coupler, the terminator for connecting to another end of a cable being tested, the terminator including a second indicator for indicating the continuity of the cable being tested when the first test port is connected to the one end of the cable.

The present invention also provides an electrical continuity tester for testing the continuity of a cable between one end to another end, comprising a main housing having first and second ends; a first test port disposed at the first end, the first test port for being connected to one end of a cable being tested; a circuit disposed within the main body operably connected to the first test port, the circuit including a first indicator for indicating the continuity of a cable being tested; a terminator for connecting to another end of a cable being tested, the terminator including an identifier indicia; and the circuit including an identifier circuit for identifying the terminator such that when the first test port is connected to one end of the cable, the identifier circuit generates an indicia corresponding to the identifier indicia.

The present invention relates to the field of electronic continuity testing and line tracing devices. The device is designed as a light weight and ergonomic continuity tester that can be stowed in a shirt pocket.

The present invention is used to confirm continuity and to test for shorts on any wire or cable. Conversion adapters are available in a kit case for testing various connectors or cables by using the appropriate F-type adapter.

Further the present invention incorporates a surge protector to protect the device from over-voltage when in use.

Still further, the present invention provides a continuity testing device that detects voltage within a line and further identifies for the user whether the voltage is AC or DC voltage.

BRIEF DESCRIPTION OF THE DRAWINGS

Various exemplary embodiments of this invention will be described in detail, with reference to the following figures, wherein;

FIG. 2 is a front view of the pocket toner device of FIG. 1;

FIG. 3 is a side view of the pocket toner device of FIG. 1 rotated ninety degrees clockwise;

FIG. 4 is a cross-section view of the pocket toner device taken along line 4-4 in FIG. 2;

FIG. 5 is a perspective view a first member of the pocket toner device of FIG. 1;

FIG. 6 is an exploded perspective view of the first member of the pocket toner device of FIG. 5;

FIG. 9 is a perspective view of a second member of the pocket toner device of FIG. 1;

FIG. 10 is an exploded perspective view of the second member of the pocket toner device of FIG. 9;

FIG. 13 is perspective view of an alternative embodiment of the first member in FIG. 5;

FIG. 14 is an exploded perspective view of the first member of FIG. 13;

FIG. 18 is a perspective view of an alternative embodiment of the second member in FIG. 9;

FIG. 19 is an exploded perspective view of the second member of FIG. 18;

FIG. 22 is perspective view of an alternative embodiment of the pocket toner device of FIG. 1;

FIG. 23 is an exploded perspective view of the pocket toner device of FIG. 22;

FIG. 28 is another perspective view of the pocket toner device of FIG. 27 with annotated detail;

FIG. 30 is a another perspective view of the pocket toner device of FIG. 27;

FIG. 31 is an exploded perspective view of the pocket toner device of FIG. 27;

FIG. 35 is a perspective view of a toner assembly from the pocket toner device of FIG. 27;

FIG. 36 is an exploded perspective view of the toner assembly of FIG. 35;

FIG. 41 is another perspective view of the pocket toner device of FIG. 40;

FIG. 42 is an exploded perspective view of the pocket toner device of FIG. 40;

FIG. 43 is an end view of the pocket toner device of FIG. 40;

FIG. 44 is a top view of the pocket toner device of FIG. 40;

FIG. 45 is a cross-section view of the pocket toner device of FIG. 40 taken along line A-A in FIG. 44;

FIG. 46 is a perspective view of an end cap used with the pocket toner device of FIG. 40;

FIG. 47 is an exploded perspective view of the end cap of FIG. 46;

FIG. 48 is an end view of the end cap of FIG. 46;

FIG. 49 is a cross-section view of the end cap of FIG. 46 taken along line A-A of FIG. 48;

FIG. 50 is a side view of the end cap of FIG. 46;

FIG. 53 is a perspective view of an alternative embodiment of the pocket toner device of FIG. 45;

FIG. 54 is an assembly view of the pocket toner device of FIG. 53;

FIG. 56 is a perspective view of an cap for use with the pocket toner device of FIG. 53;

FIG. 57 is an assembly view of the end cap of FIG. 56;

FIG. 60 is a perspective view of a toner assembly used with the pocket toner device of FIG. 53;

FIG. 61 is an assembly view of the toner assembly of FIG. 60;

FIG. 67 is a schematic circuit diagram of the printed circuit board used in pocket toner device of FIG. 53; and FIG. 68 is a component list common to the pocket toner devices of FIGS. 28, 40, 52 and 53.

DETAILED DESCRIPTION

Figure 1:
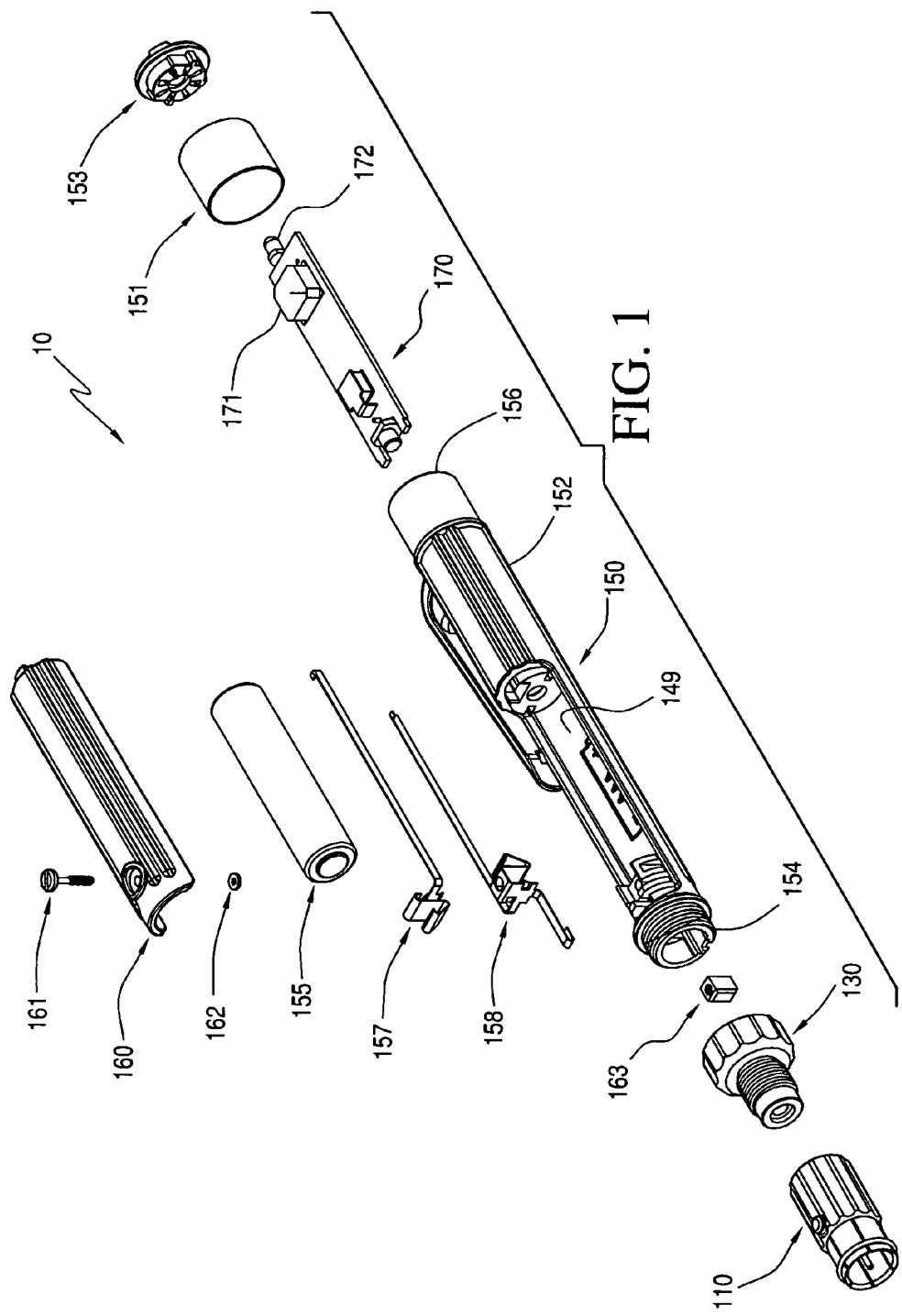
FIG. 1 is an exploded perspective view of a pocket toner device according to this invention.

The device 10 as shown in FIG. 1 is a compact pocket electrical continuity tester that fits in a shirt pocket or a tool pouch of a user or technician. The device 10 provides a user or technician a convenient continuity tester for electrical wires, lines, or cables. The device 10, when in use and connected to the electrical wire provides the technician with both an aural and visual indication as to the status of the electrical line being tested.

The present invention is used to confirm continuity and to test for shorts on any wire or cable. Conversion adapters are available in a kit case for testing various connectors or cables by using the appropriate F-type adapter.

The device 10 includes a first member 110, a second member 130 and a third member 150. The first member 110 is removably attached to the second member 130. The second member 130 is removably attached to the third member 150.

The first member 110 in the present embodiment and as shown in FIGS. 5 through 8, is a removable F-type female to F-type male push adaptor. The first member 110 is also called an identifier unit. It should be appreciated that in other various exemplary embodiments the first member could be a F-type female to F-type female connector.

Referring to FIGS. 5-8, the first member 110 includes a cylindrical body 112 having a first end or push male F-type connector 113, a second end or threaded female F-type connector 114 and a first Light Emitting Diode (LED) 115 as shown in FIG. 6. The first end 113 is a push male F-type connector. However, it should be appreciated that in other various exemplary embodiments, a thread male F-type connector may be used. The second end 114 threads onto the second member 130. The first LED 115 is a single color LED. In the present embodiment the color is green; however it should be appreciated that in other various exemplary embodiments the first LED could have any color.

Figure 8:
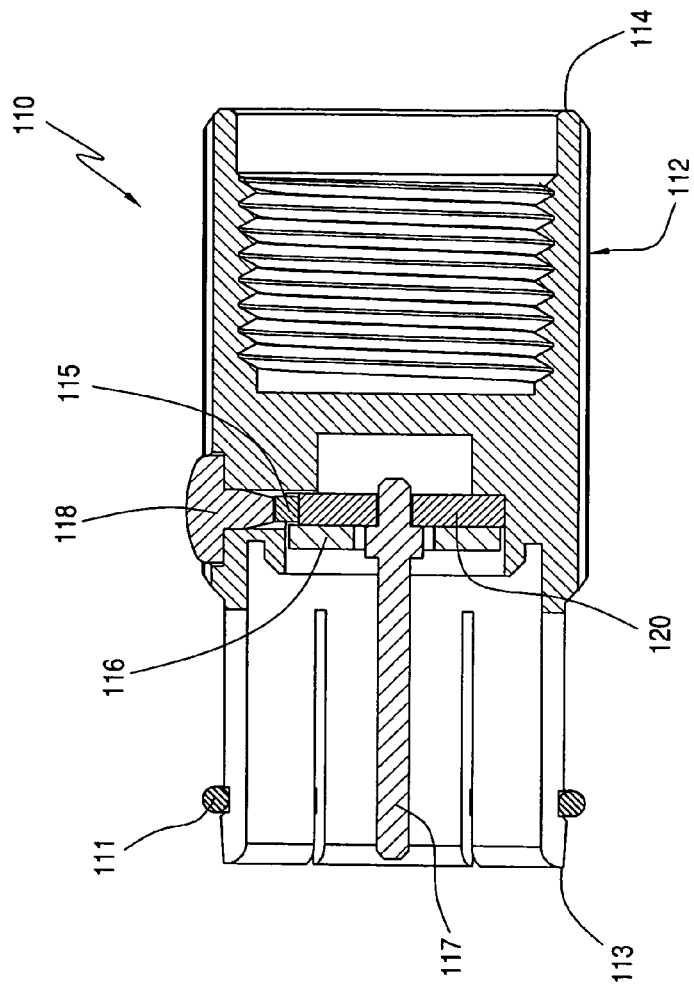
FIG. 8 is a cross-section view of the first member of FIG. 5 taken along line 8-8 in FIG. 7.
Figure 7:
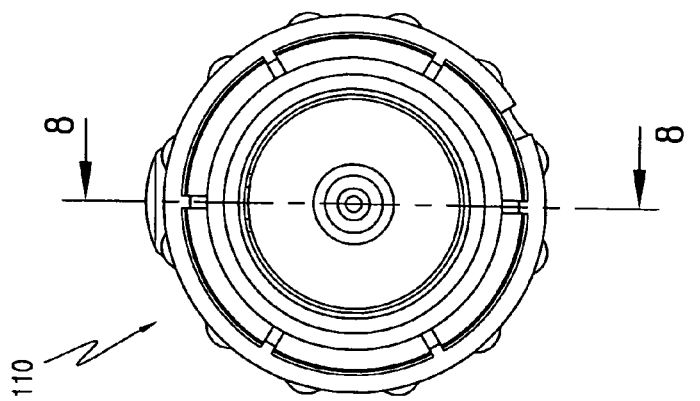
FIG. 7 is a front view of the first member of FIG. 5.
Figure 12:
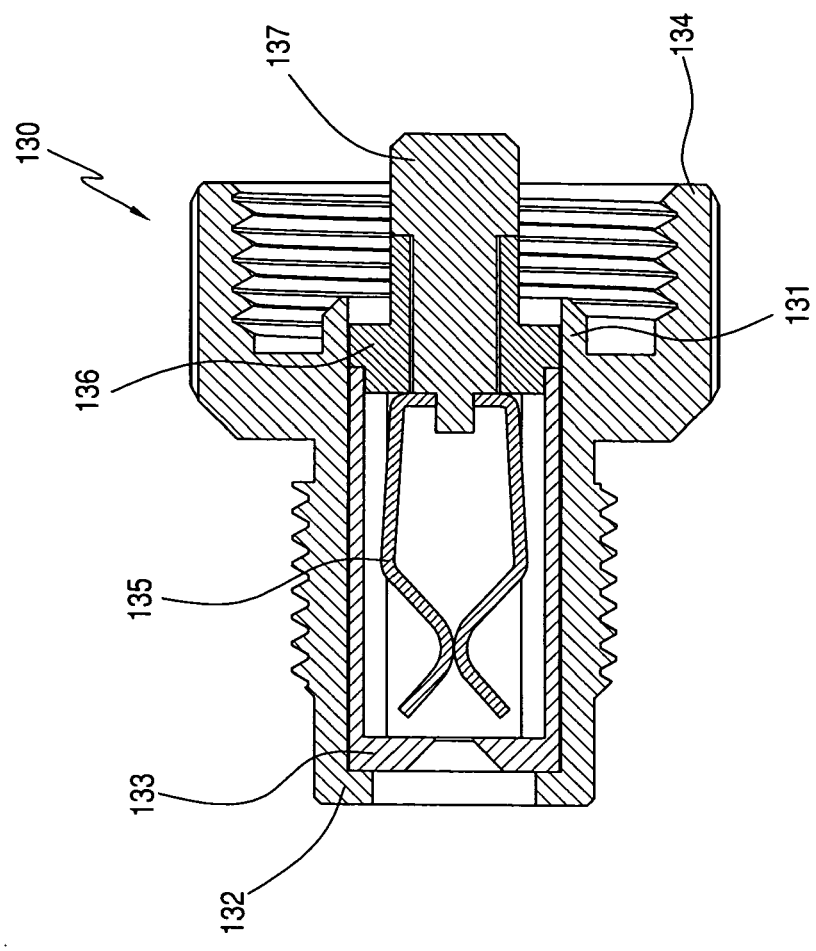
FIG. 12 is a cross-section view of the second member of FIG. 9 taken along line 12-12 in FIG. 11.
Figure 11:
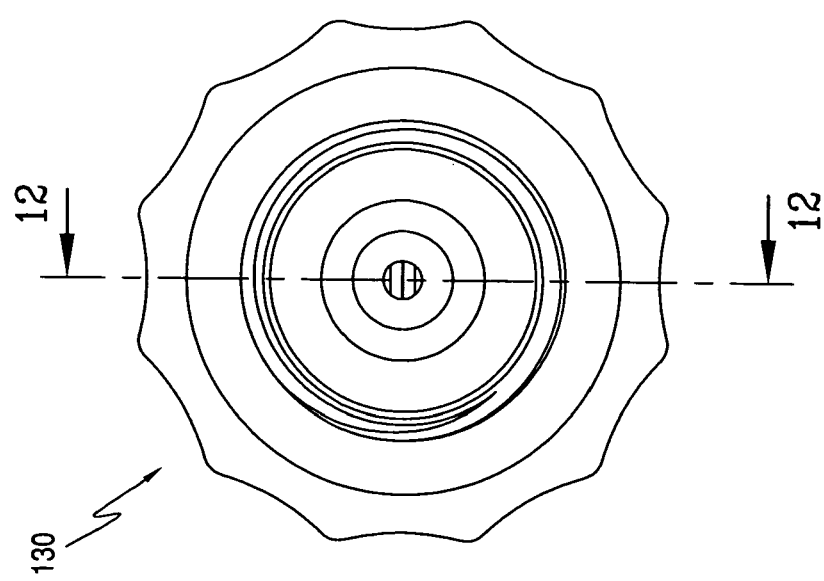
FIG. 11 is a front view of the second member of FIG. 9.
Figure 15:
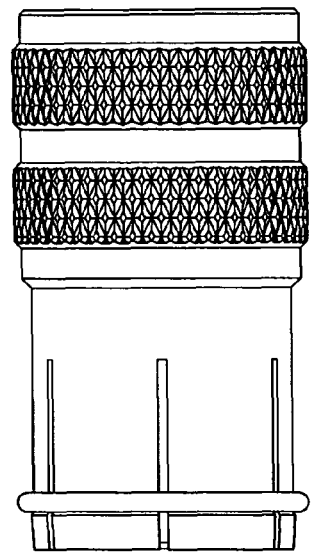
FIG. 15 is a side view of the first member of FIG. 13.
Figure 17:
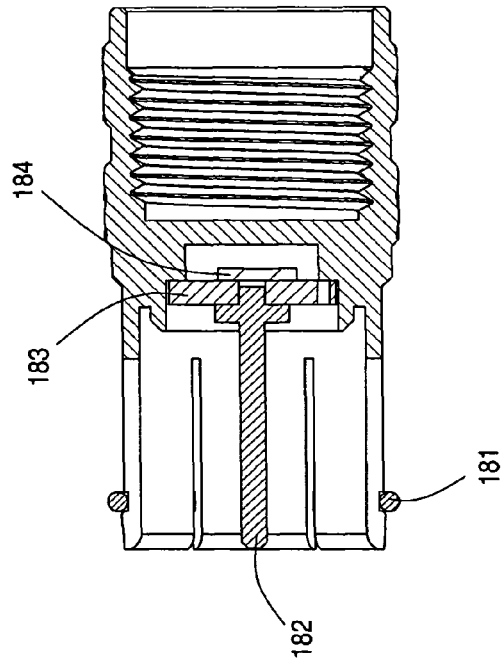
FIG. 17 is a cross-section view of the first member of FIG. 13 taken along line A-A in FIG. 16.
Figure 16:
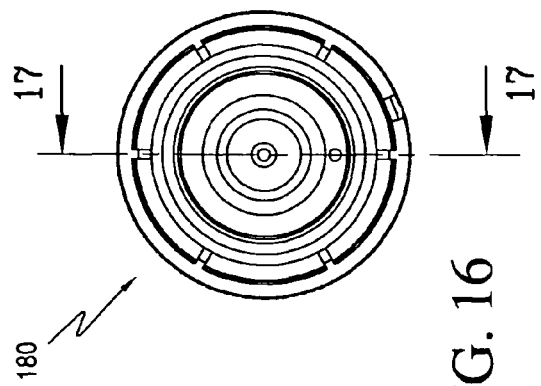
FIG. 16 is a end view of the first member of FIG. 13.
Figure 21:
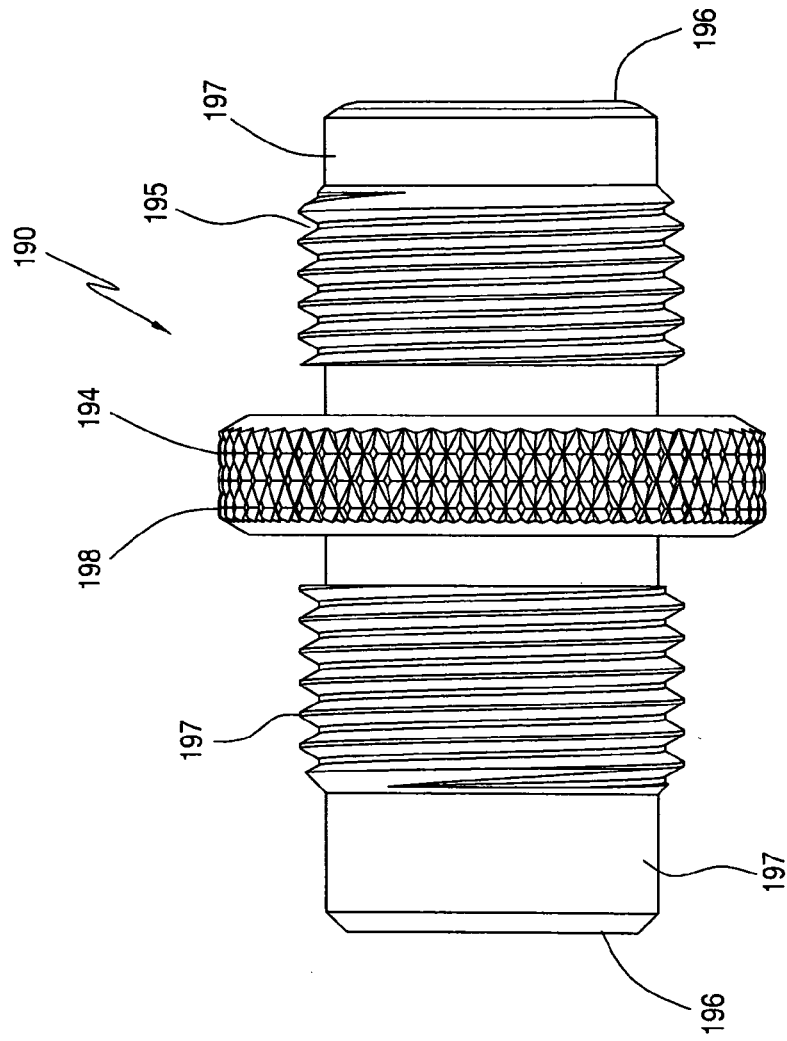
FIG. 21 is a side view of the second member of FIG. 18.
Figure 20:
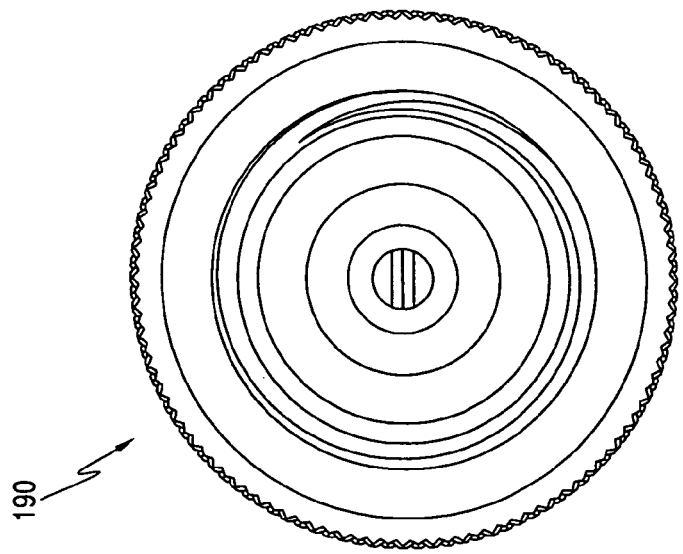
FIG. 20 is an end view of the second member of FIG. 18.
Figure 24:
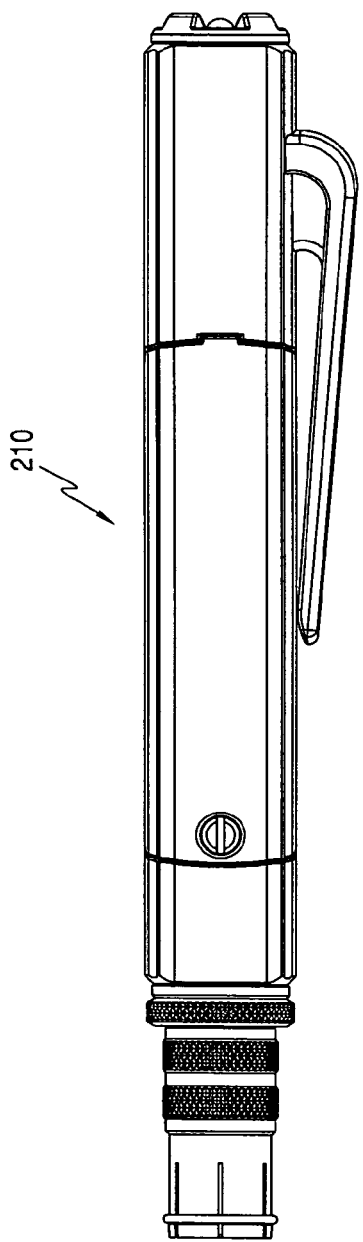
FIG. 24 is a side view of the pocket toner device of FIG. 22.
Figure 25:
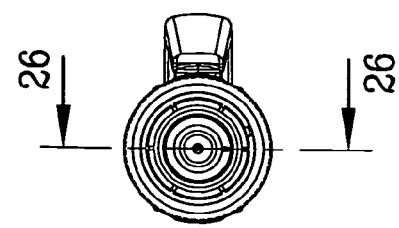
FIG. 25 is an end view of the pocket toner device of FIG. 22.
Figure 26:
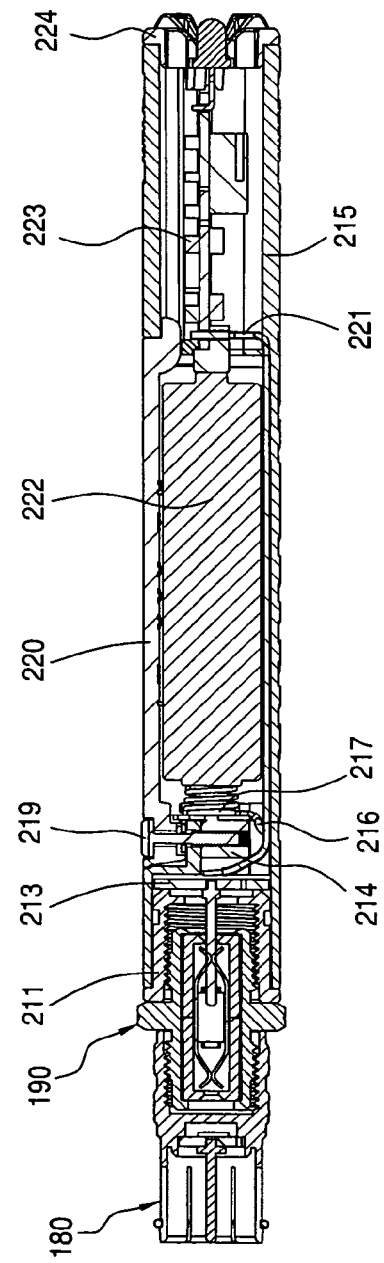
FIG. 26 is a cross-section view of the pocket toner device of FIG. 22 taken along line A-A in FIG. 25.
Figure 27:
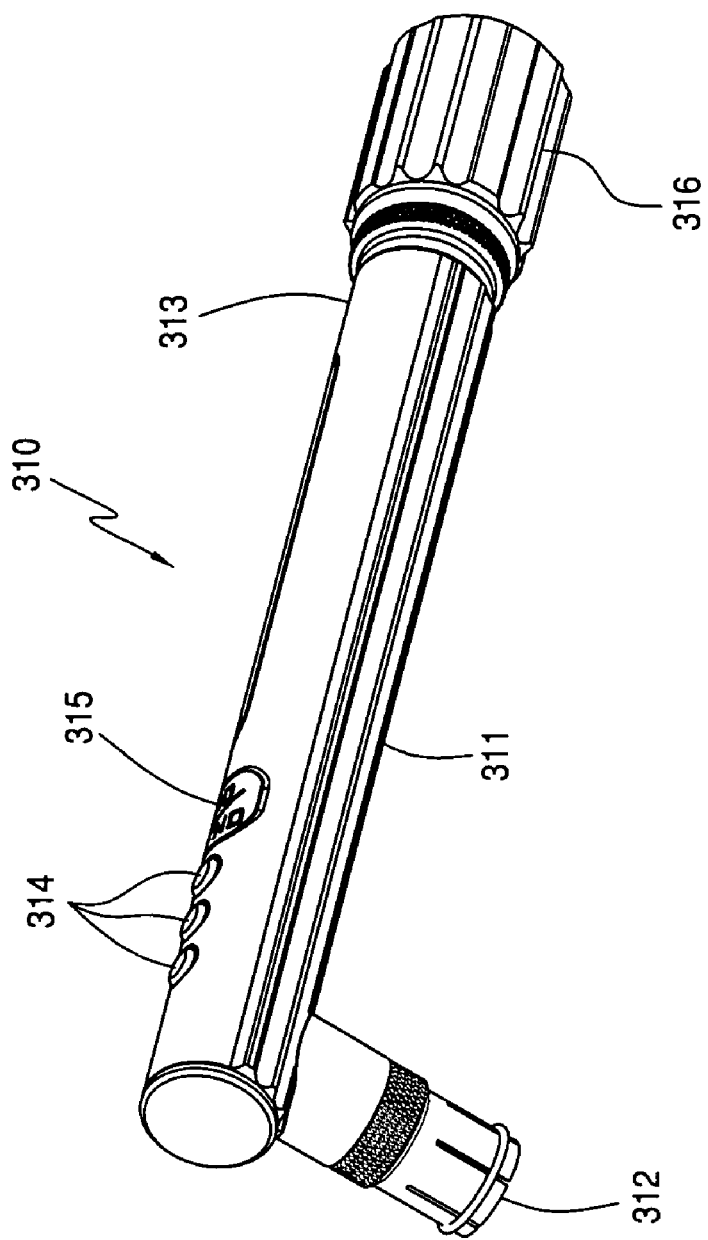
FIG. 27 is a perspective view of an another alternative embodiment of the pocket toner device of FIG. 1.

The first member 110 further includes a ring 111, a nonconductive washer 116, a first electrical connector or pin 117 a LED lens 118 and a first printed circuit board (PCB) 120. As shown in FIGS. 6 and 8 the pin 117 is disposed on the first PCB 120. The first PCB 120 includes circuitry to connect the male F-type to second member 130 and circuitry to the first LED 115.

Referring to FIGS. 9-12, the second member or removable tip 130 is a removable F-type female connector. The second member 130 has a first end 132 and a second end 134. The first end 132 is the F-type female connector. It should be appreciated that in other various exemplary embodiments, the first end could be other type connectors such as, but not limited to a male F-type connector. When the device 10 is in use, the first end 132 is connected to the cable or line.

The second member 130 provides an additional feature over conventional pocket toners in that the second member 130 is removable. The part of conventional pocket toners that attaches to the cable is not removable and fails over the life of the conventional toner due to fatigue. The device 10 allows the technician to replace the second member 130 if the second member 130 fails due to fatigue.

The second end 134 of the tip 130 threads into the third member 150. The tip 130 further includes a body 131, a pin seizure insulator 133, a pin seizure 135, a pin contact insulator 136 and a pin contact 137.

The third member includes a main body 152, a first end 154 and a second end 156. The first end or test port 154 is threaded to receive the second member 130. The main body 152 of the device 10 is made of a transparent non-conductive plastic to minimize electrical shock exposure. The main body 150 has a cylindrical shape and an internal compartment 149. It should be appreciated that in other various exemplary embodiments, main body shapes other than cylindrical may be used, for example, rectangular shaped. Additionally, the main body 152 has a compartment cap 160. The device 10 contains within the main body 152 a cylindrical battery 155 that fits into the internal compartment 149. In the present embodiment the battery 155 is an AAA 1.5V battery. However, it should be appreciated that in other various exemplary embodiments, other types of cylindrical batteries may be used.

The third member 150 further includes a cover 160, a fastener 161, a washer 162, a fastener anchor 163, a positive contact trace 157, a negative contact trace 158 and a second PCB 170. The positive contact trace 157 and the negative contact trace 158 provide electrical connectivity between the second member 130, the second PCB 170 and the battery 155.

The main body 150 further includes a band 151 and a end cap 153. The end cap 153 is affixed adjacent to the second end 156. The band 151 is operably configured to fit over the second end 156

The second PCB 170 includes circuitry common to conventional toners to test the continuity and trace electrical circuits. The circuitry in the second PCB 170 is used to test with any F-type connector or F-type conversion adaptor. The second PCB 170 further includes surge protection circuitry which protects the device 10 against over-voltage. The surge protection circuitry employed can be any known or later developed surge protection circuitry. The over-voltage protection is key to protecting the circuitry of the device 10.

Referring to FIGS. 1, 3 and 4, the second PCB 170 further includes a circuit that drives two indicators, a buzzer 171 and a second LED 172. The buzzer 171 is disposed on the second PCB 170. The second LED 172 is a tri-color LED and is disposed on the second PCB 170 such that the second LED 172 protrudes through an orifice in the end cap 153. The positioning of the two indicators, the buzzer 171 and the second LED 172 approximate to the second end 156 provide for an ergonomic position for testing with the two indicators facing a technician performing the test. When in use the device 10 is held like a pen or pencil providing to the technician maximum exposure to the two indicators, the buzzer 71 and the second LED 172.

The second PCB 170 is disposed at the second end or indicator side 156 of the main body 150 with the positive contact trace 157 and the negative contact trace 158 run to the battery 155, which has a positive and negative end, and to the tip 130. Additionally, the positive contact trace 157 and the negative contact trace are wired to the second PCB 170, and supplies electrical power to the second member 130. The first PCB 120 in the removable F-female to F-male push adaptor 110 is used to transfer power to the first LED 115 when continuity is achieved with a cable under test causing the first LED 115 to illuminate. The circuit is at that point complete causing the second PCB 170 to complete the circuit to the buzzer 171 and the second LED 172. The LED 172 will show a first color indicator indicating continuity. In the present embodiment, the first color is green. In the case of a short, the second LED 172 will indicate a second color. In the present embodiment the second color is red.

The second LED has a third color to indicate voltage present in the line. The in the present invention the third color is yellow. It should be appreciated that in other various exemplary embodiments, the first, second and third colors could by any variety of colors. The buzzer 171 is preferably a piezo type buzzer indicating continuity with a sound. No sound will be produced for a short condition.

The device 10 made in accordance with the present invention is an economical continuity tester utilizing the single 1.5 v AAA battery 115 as the power source to engage the second PCB 170 accessing both sight and sound indicators to perform various cable and wire testing functions.

The device 10 has an all-plastic case comprised of the identifier unit or identifier adaptor 110 and the main body 150. The only exposed metal sections of the device 10 are the F-female to F-male push connector in the identifier unit 110 and the F-female to F-female speed in the tip or F-type 81 connector 130.

The technician tests the line by applying the removable identifier adaptor 110 to one end of a cable under test and then inserting the second member or tip 10 while the tip 130 is connected to the main body 150 into a standard F-type male connector into the other end of the cable.

The device 10 provides another additional feature. Even if the identifier adaptor 110 is still attached to the tip 130, the device 10 can still be used to quick-test indicating the results by either a red (shorts) or green (termination) LED illuminating. The device 10 is the lightest, most compact tool of its kind specifically designed to fit in a shirt pocket requiring no more space than a pen. The device 10 is an ergonomic tester that allows the technician to hold the tool in the same manner as one would hold a pen with the indicator lights facing the operator. Such optimum positioning offers the user a nearly effortless ability to clearly see and hear the line conditions of the cable under test.

The plastic main body 150 of the device 10 significantly reduces the exposure to potential electrical shock, along with the destruction of the device, when accidentally testing live circuits. The various features of the device 10 provided by the components contained in the second PCB 170, powered by an ordinary 1.5-volt battery 155, considerably increase the overall function and reliability of the device 10 over other conventional devices.

FIGS. 13 through 17 show a first member 180, which is an alternative embodiment of the first member 110 of the device 10. The first member 180 includes all the features and characteristics of the first member 110 except the first member 180 does not included an LED light. The first member 180 includes a ring 181, a pin 182, a printed circuit board 183 for connecting the pin 182 to the main circuit board 170, a SMD resistor 184 connected to the PC board 183 and a housing 185. The housing 185 includes knurled surfaces 186 for non-slip finger hold when replacing.

FIGS. 18 through 21 show a second member 190, which is an alternative embodiment of the second member 130. The second member or coupler 190 is a female to female coupler unlike the second member 130, which is a male to female coupler. The second member 190 includes a case 191, a conductor 192, and two insulators 193. The case 191 has two ends and a knurled portion 194 on a cylindrical portion 198 used for turning the member with the fingers. Each end includes threads 195 disposed a distance from the edge 196, leaving a portion 197 without threads. This is unlike conventional couplers, which have the treads all the way to the edge. Having the threads displaced away from the edge of the end allows the user to insert the coupler into a male F-Type connector, without having to screw the coupler on. This permits the quick testing of several wires, as the user simply places the coupler on the terminus of a wire or cable without screwing the coupler on. The user then simply pulls the coupler off and places it on the next wire or cable to be tested. Additionally, conventional couplers have a hex shaped body so that the conventional coupler may be tightened with a wrench or pliers. The second member 190 uses the knurled portion 194 to allow the user easily turn the coupler 190 on or off of a device or cable end. In the present embodiment the threads are displaced generally about 2.51 mm. It should be appreciated that in other various exemplary embodiments, other distances may be employed.

Now referring to FIGS. 22 through 26, a pocket toner device 210 made in accordance with the present invention is shown. The pocket toner device shown in FIGS. 22 through 26 is an alternative embodiment of the device 10 as described above and includes all the features of the device 10. The pocket toner device in FIGS. 22 through 26 is different from the device 10 in that this embodiment includes the use of the alternative embodiment of the first member 180 and the second member 190. The pocket toner device 210 includes the first member 180, the second member or coupler 190, a F-sleeve 211, a pin 212, a printed circuit board 213, a battery screw block 214, a housing 215, a lead wire 216, a battery contact 217, a battery screw washer 218, a battery door screw 219, a battery door 220, a lead wire 221, a battery 222, a printed circuit board 223 and a cap 224.

Figure 34:
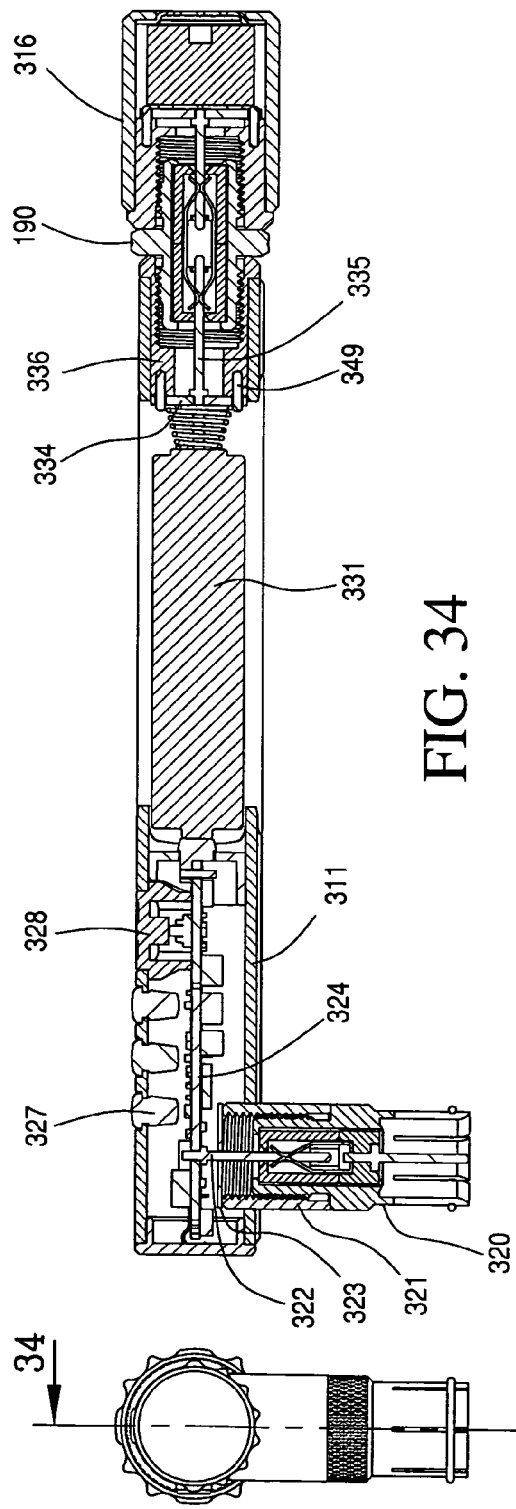
FIG. 34 is a cross-section view of the pocket toner device of FIG. 27 taken along lines A-A of FIG. 33.
Figure 33:
FIG. 33 is an end view of the pocket toner device of FIG. 27.

The device 310, shown in FIGS. 27 through 34, is a pocket toner device made in accordance with the present invention. The device 310 is similar to the devices 10 and 210 described above. The device 310 includes a main body 311 having a first end or test port 312 and a second end 313. The main body further includes a printed circuit board (PCB) and a batter compartment, as shown in FIG. 31. The test port 312 comprises a removable push-on male F-adapter or connector 320 (see FIGS. 47 and 49, item 422) connected to a collar 321. The opposite end of the connector 320 includes a threaded female F-adapter that connects to a pin 322 secured to a disc 323. The inside threads on collar 321 are cut back from the outer edge of the collar to a provide an unthreaded portion for quick testing of female F-connectors without the need to thread them on fully, as shown in FIG. 34. The pin is operably connected to a printed circuit board 324. The pin 322 and the collar 321 comprise a male threaded F-connector, which is more durable than a female F-connector and allows for compact installation of the removable push-on male F-adapter or connector 320. The connector 320 is easily replaced when damaged. A cap 325 and a dust seal 326 encloses the circuit board 324 within the main body 311. Light pipes 327 transmit light from the LED's on the circuit board 324 during use. A switch button 325 interacts with a switch on the printed circuit 324 to turn the device on or off. A door pin 329 hinges a battery door 330 into a battery compartment for a battery 331, which is operably connected to the circuit board 324. A screw 332 secures the battery door 330 in the closed position to the main housing 311. A wire 333 connects the circuit board 324 to a secondary printed circuit board 334, which is operably connected to a pin 335. PCB pins 349 secures the circuit board 334 to a sleeve 336 which is received at the second end of the main housing 311. The coupler 190 is removably secured to the sleeve 336. The toner assembly 316 is removably attached to the free end of the coupler 190.

The device 310 is different from the devices 10 and 210 in that the device 310 the first end or test port 312 is disposed at generally right angles to the main body 311. The right angle orientation allows for use in tight spaces and for easy connection to wall plate ports. Additionally, the main body includes a male F-Type connector 313 disposed at the second end. Further the main body includes a plurality of LED indicators 314 that provide a visual indication to the user of voltage, shorts, continuity, and power on status. The main body also includes an on-off switch 315.

The device 310 further includes a toner assembly 316 as shown in FIGS. 28 and 31. The toner assembly 316 includes a buzzer that provides an aural indication of continuity to the user. The device 310 also provides a visual indication of continuity to the user with a green LED light 318 on the main body 311. Continuity is determined by a resistance, preferably 50 to 70 Ohm, in a terminator. The toner assembly 316 is removably connected to the main body by the use of the second member or coupler 190 of the device 210 described above. The coupler 190 allows the toner assembly 316 to connect to the F-type connector 313 disposed on the second end of the main body. The second end further includes an additional PCB. This additional PCB places the F-Type connector disposed on the second end in electrical communication with the battery and the main PCB. The device 310 shown in FIG. 28 also includes voltage detection by means of an amber portion of a bi-colored LED 317. A short in the cable is indicated by the red portion of the LED 317. Power on is indicated by a red LED 319.

The device 310 provides voltage protection through circuitry included in the PCB 324 such that it is unaffected by extended connection to external voltages up to 35 V (either polarity) present on the test line, allowing for testing of telephone, satellite, security and fire systems. The main body of the device 310 in the present embodiment is a durably brass housing unlike the molded plastic main bodies of the devices 10 and 210. The device 310 additionally includes a removable push-on F-Type adaptor disposed at the first end. When not in use, the toner assembly 316 is attached to the main body 311. The test port 312 is a replaceable push-on F-connector that also allows easy use of adapters to other wiring types. The device 310 is advantageously pocket-sized.

Figure 29A:
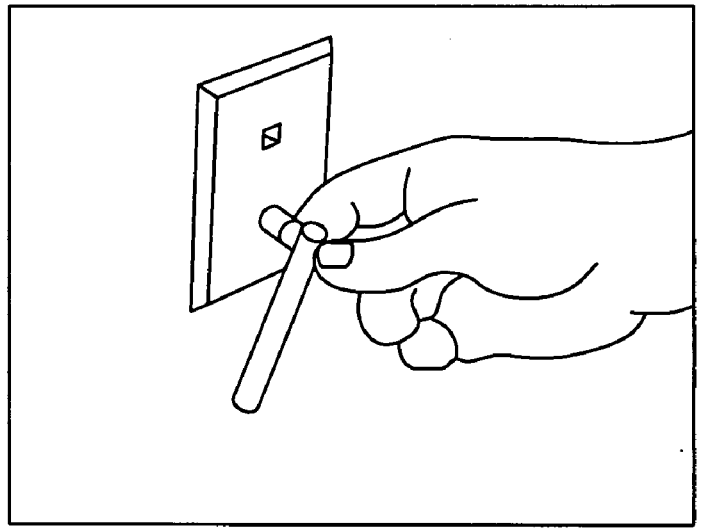
FIG. 29A shows the device of FIG. 28 being connected to a video coaxial wall outlet in a remote location.
Figure 29B:
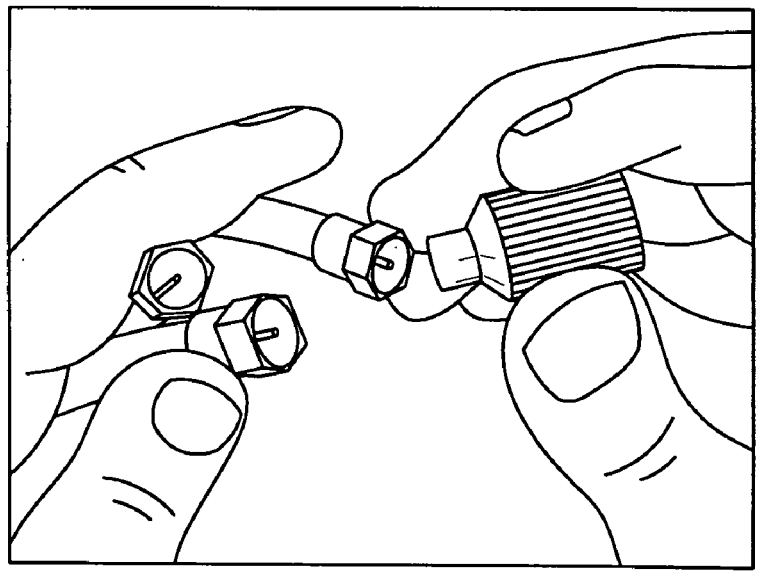
FIG. 29B shows the toner assembly of FIG. 28 being connected to a cable at a homerun location.
Figure 32:
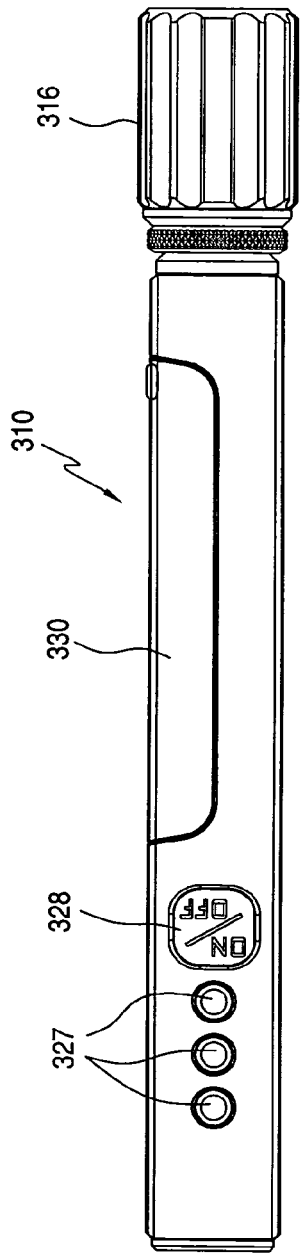
FIG. 32 is a side view of the pocket toner device of FIG. 27.

When in use, the toner assembly of the device 310 is removed from the main body 311 or sending unit. The main body 311 is placed on a video coaxial wall plate connector in a remote location such as a bedroom, as shown in FIG. 29A. It should be appreciated the in other various exemplary embodiments the device 310 may be used for other types of cable or wire connectors, by using a different adaptor other than the push-on F-Type adaptor described above. If the device 310 shows a red LED light a short is present in the cable or wire being tested. While the main body or sending unit is still attached to the wall plate, the toner assembly 316 is taken to the main cable junction box of the dwelling having a plurality of cable endings, as shown in FIG. 29B. The toner assembly, with the coupler 190 is quickly and only partially placed into the usually male ends of the coaxial cable, since the coupler 190 is only partially threaded as described above. As the toner assembly 316 is placed on the cable endings, the toner assembly 316 will emit a tone when the correct cable corresponding to the cable having the main body 311 or sending unit attached. If the cable has a bad continuity no tone will be emitted from any of the cables.

Figure 38:
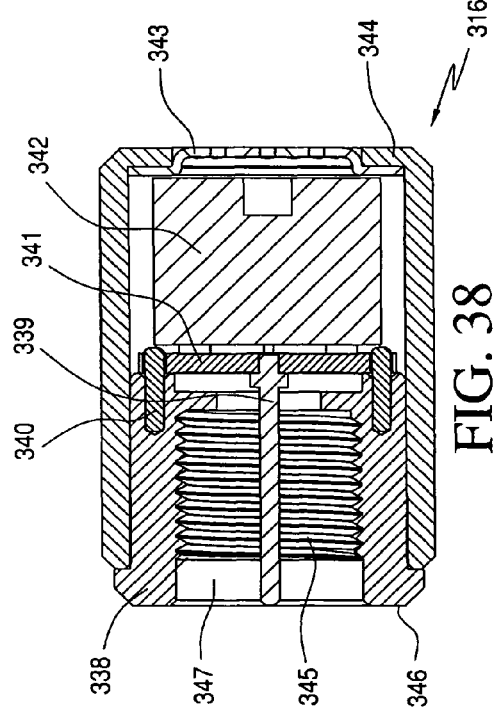
FIG. 38 is a cross-section view of the toner assembly of FIG. 35 taken along line A-A in FIG. 37.
Figure 39:
FIG. 39 is a side view of the toner assembly of FIG. 35.
Figure 37:
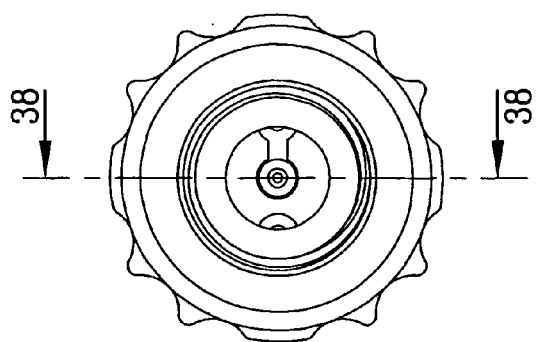
FIG. 37 is an end view of the toner assembly of FIG. 35.

FIGS. 36 through 39 show in detail the toner assembly 316 discussed above. The toner assembly 316 includes a sleeve 338, a pin 339 operably connected to a printed circuit board 341, sleeve pins 340 that attach the printed circuit board 341 to the sleeve 338, a buzzer 342 operably connected to the printed circuit board 341, a screen 343 and a case 344. The sleeve 338 and the pin 339 combine to form a male F-Type connector and are disposed at a first end of the toner assembly. The buzzer and screen are disposed within the case and at a second end of toner assembly. The case in the present embodiment is brass. However, it should be appreciated that in other various exemplary embodiments, other materials may be used. The printed circuit board is in electrical continuity with the pin and the buzzer. Referring to FIG. 38, the inside threads 345 are held back from the edge 346 to a provide an unthreaded portion 347 for quick testing of female F-connectors without the need to thread them on fully.

Figure 40:
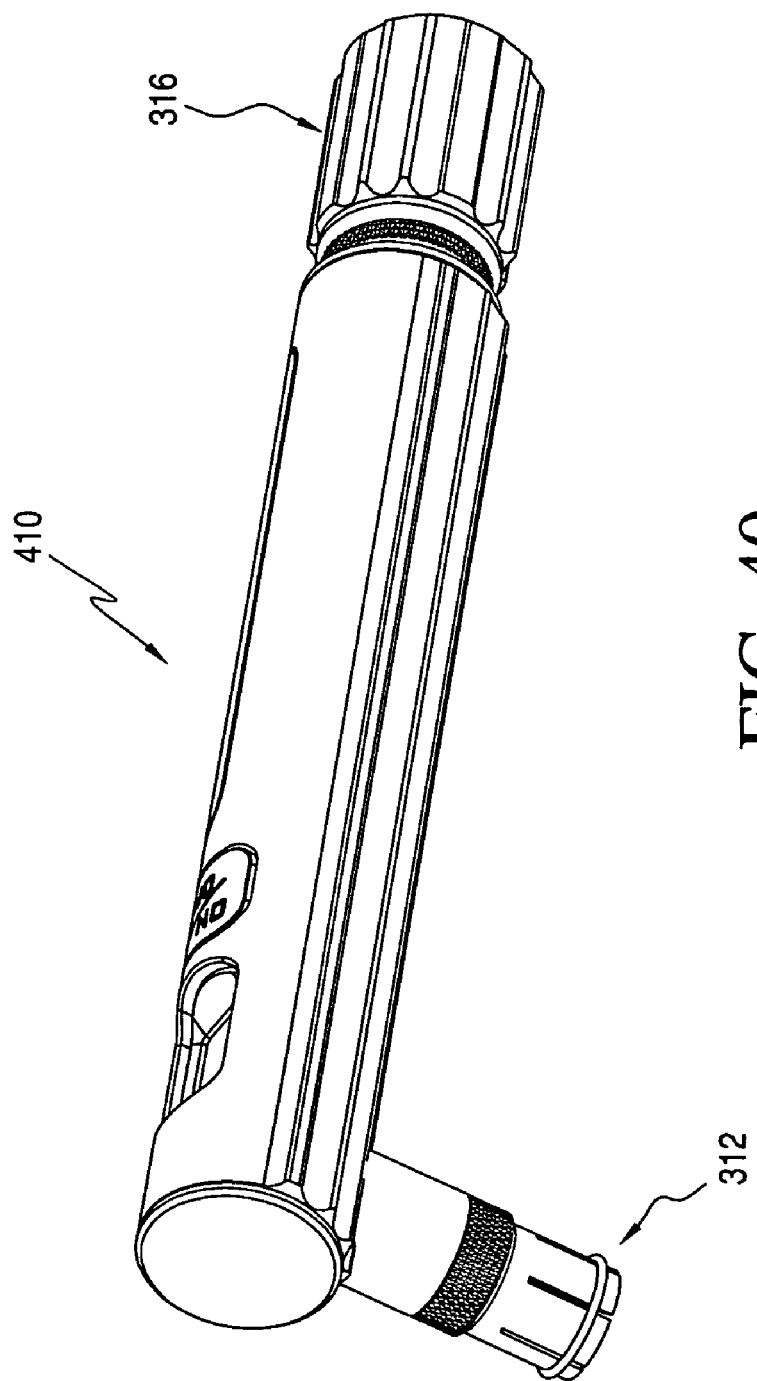
FIG. 40 is a perspective view of yet another alternative embodiment of the pocket toner device of FIG. 1.

Now referring to FIGS. 40 though 45, a pocket toner device 410 made in accordance with the present invention is shown. The device 410 is an alternative embodiment of the device 310. Like the device 310 the device 410 includes a main body, wherein the main body or sending unit includes a test port having a male F-Type connector, a second end having an additional printed circuit board with a male F-Type connector, a battery compartment and a main printed circuit board (PCB). The pocket toner device 410 further includes a toner assembly and coupler 190 as described above.

The device 410 is different from the device 310 in that instead of using a plurality of LED lights, the pocket toner device 410 uses a numeric digital display 411 comprised of multiple LEDs in a conventional figure eight pattern. Display lens and display bezel 414 work with the display 411. Additionally, the device 410 includes voltage surge protection incorporated into the PCB 412. Still further, the device 410 has a power save feature incorporated into the PCB 412, wherein after a period of time, preferably about five minutes, of non use, the device 410 will automatically shut off. Also the device 410 uses a AA battery vice a AAA battery as in the devices 10, 210 and 310.

The pocket toner device 410 also includes the use of ID end caps or terminators 415. The end caps 415 as shown in FIGS. 46 through 50 are used in conjunction with the device 410. The end caps are placed on the video coaxial wall plate connector in a remote location such as a TV room or a bedroom. A plurality of end caps may be used. The present embodiment is set up to track up to 8 end caps. However, it should be appreciated that in other various exemplary embodiments, any number of end caps may be used.

When in use, the pocket toner device 410 is used at the main junction box of a building, unlike the device 310 which preferably has the toner assembly at the junction box. The device 410 permits the user to test the voltage, continuity or short and 50 to 70 Ohm termination of a plurality of lines at one time. The user or technician would place the end caps 415 on the lines in the remote rooms to be tested. Then the technician uses the main body or sending unit with the toner assembly still attached at the junction box, placing the test port 312 with the push-on F-type adaptor 320 on the cable ends at the junction box. The pocket toner device 410 will indicate visually through the display 411 and aurally for each line that has an end cap the voltage present (if any), a short or continuity. The continuity will also be indicated by a tone from the toner assembly 316.

The end caps 415, referring to FIGS. 46 through 50, include a cap 416 having a numerical or other indicia 417, a printed circuit board (PCB) 418, a resistor 419 disposed on and in electrical continuity with the PCB 418, a pin 420 operably connected to the printed circuit board 419, a collar 421 and a push-on F-Type adaptor 422. The collar 421 and the pin 420 form an integrated male threaded F-connector, which is more durable than an integrated push-on male F-connector adapter and allows for compact installation of a variety of adapters to test virtually any wire or cable type. The end cap 415 is unaffected by extended connection to any low voltage system with voltages up to 48V (either polarity) present on the test line, making the device 410 suitable for testing telephone, satellites, security, fire and other systems without damaging the device. Referring to FIG. 49, the threads 425 are held back from the edge 426 to provide an unthreaded portion 427 for quick testing of female F-connectors without the need to thread them on fully. The collar 421 is operably configured to receive the treads of the push-on F-Type adaptor 422. The collar 421 also has an opening wherein the PCB having a male pin is inserted. The cap 417 is operably configured to fit over the PCB and a portion of the collar to cover and protect the PCB. The push-on F-Type adaptor 422 is removable so that other types of adaptors may be used. The resistor 418 allows the circuit 412 to identify which specific end cap is connected at the other end of the cable being tested.

Figure 51:
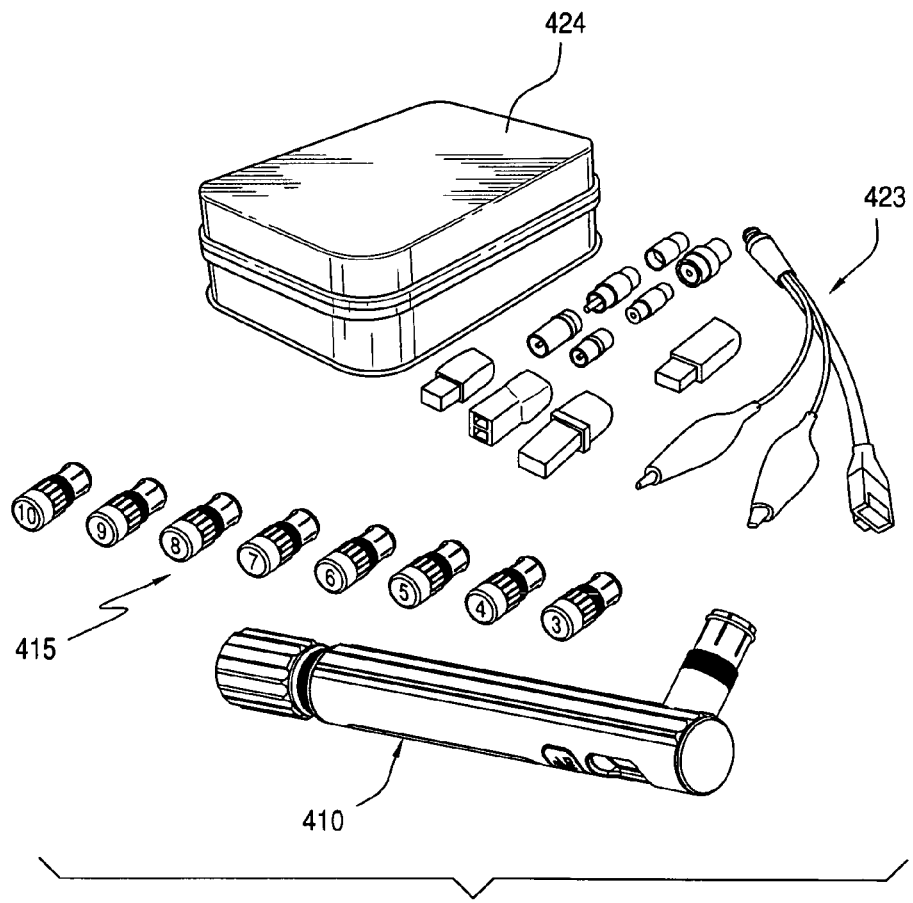
FIG. 51 is a perspective view of the pocket toner device of FIG. 45 showing accessories that may be used with the pocket toner device.

FIG. 51 is a sample of the device 410 and the end caps 415 along with other connectors 423 that may be employed with the pocket toner device 410. In addition to the video coaxial cable connections described above, the pocket toner device 410 may be used with audio, security, local area network (LAN), RJ-11, RJ-46 and block 66 type connectors. A carrying case 424 provides a convenient storage for all the components when not in use.

Figure 52:
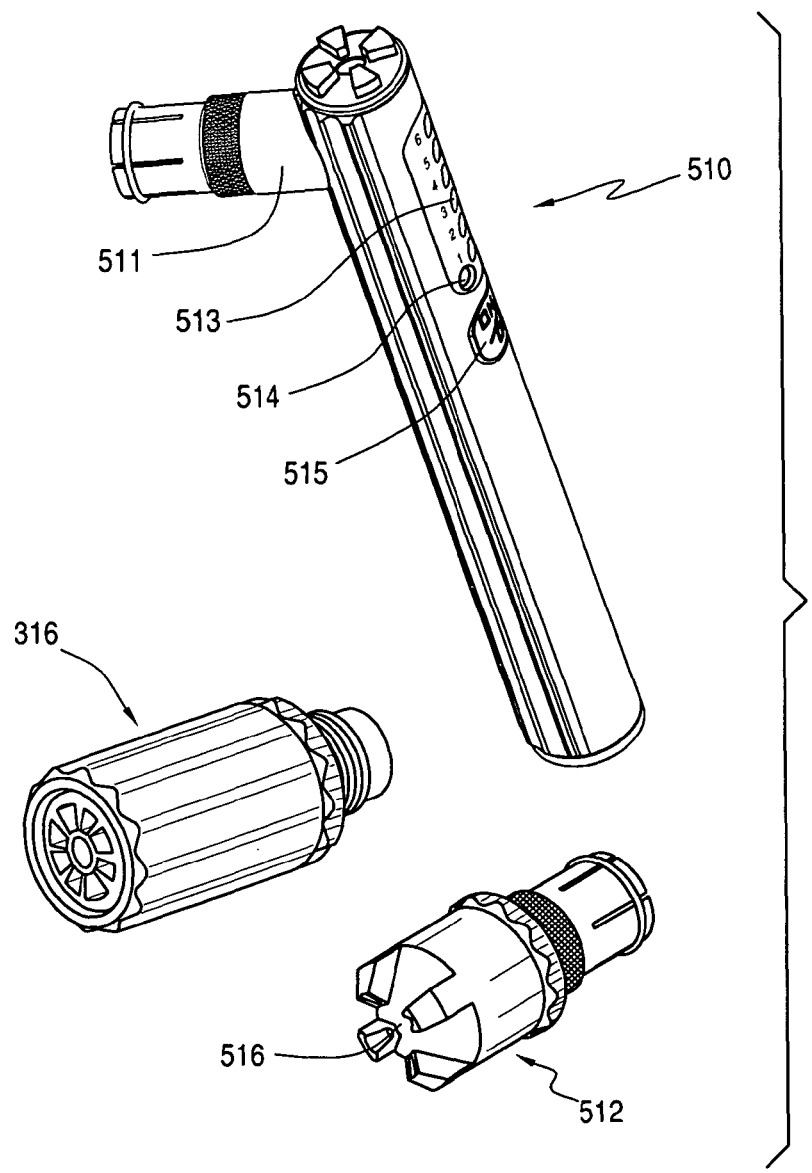
FIG. 52 is a perspective view of an alternative embodiment of the of the pocket toner device of FIG. 45.
Figure 55:
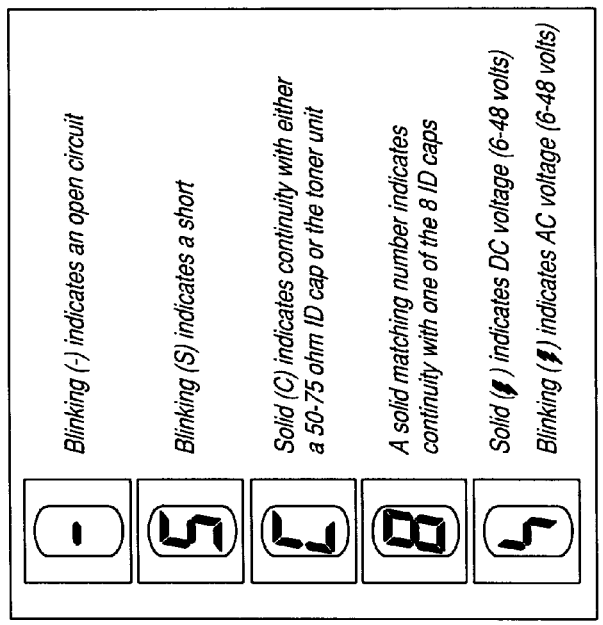
FIG. 55 is an illustration of the various display symbols provided on a display of the pocket toner device of FIG. 53.

FIG. 52 presents a pocket toner device 510. The device 510 is an alternative embodiment to the device 410. The pocket toner device 510 is similar to the device 410 and includes the same features. The pocket toner device 510 includes bi-colored LED 511 that provides a red light to indicate a short in the cable, or a amber light when voltage is detected in the cable. Continuity with up to six terminators or end caps 512 is provided with numbered green LEDs 513 corresponding to the numbered end caps 512. More or less than the indicated number terminators may be used with the appropriate modification to the main printed circuit board, as is well known to a person of ordinary skill in the art. An indicator LED 514 provides an indication of power-on state. A push-on push-off switch 515 is provided. The terminator 512 includes the indicia 417 in addition to a LED 516 that provides an indication of continuity in the cable. The buzzer in the toner assembly 316 provides an audible indication of continuity in the cable being tested.

The device 510 is different from the device 410 in that the device 510 does not have a numeric digital display, but rather a plurality of LED lights 513, one for each end cap 512 and an additional LED light 511 to indicate voltage detection and short. Also the PCB of the 510 device does not include voltage surge protection. Further, the second end of the main body of the 510 device is threaded to receive the toner assembly 316. The device 510 does not include an additional PCB and a male F-Type connector on the second end.

Another embodiment of a pocket toner device 610 is disclosed in FIG. 53. The device 610 is similar to the device 410, except for several features. The device 610 has a buzzer 611 disposed at the first end of the main housing 612. The buzzer 611 is operated to sound to indicate a change in the test line's condition. Access to the battery 613 is through the second end of the main housing 612. A cap closes 614 closes the battery compartment. The cap 614 is configured to threadedly receive the coupler 190. The toner assembly 316 is removably secured to the other end of the coupler 190, as in the other embodiments. A printed circuit board 615 includes a display 616 that provides indicators of the condition of the cable being tested. Examples of various information shown through the display 616 are shown in FIG. 54. The circuit board 615 also includes a circuit for detecting AC or DC voltage on the line being tested.

Figure 58:
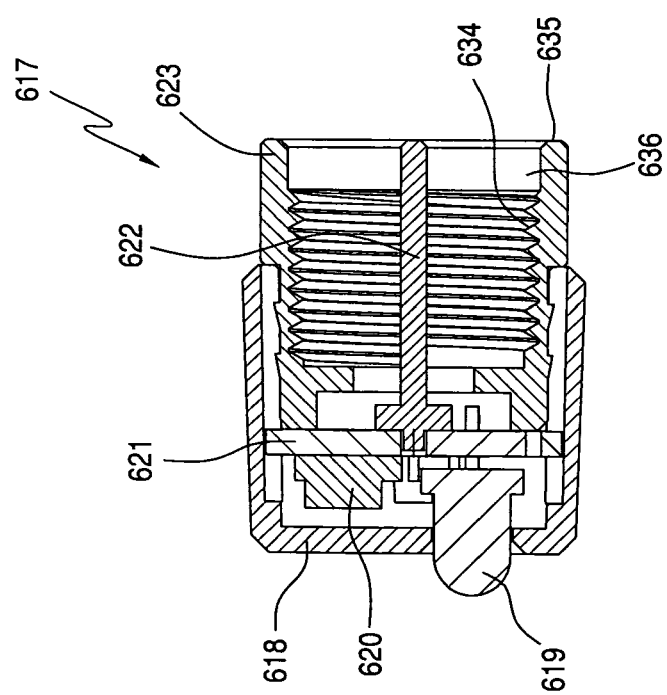
FIG. 58 is a cross-sectional view taken along line 58-58 of FIG. 56.
Figure 59:
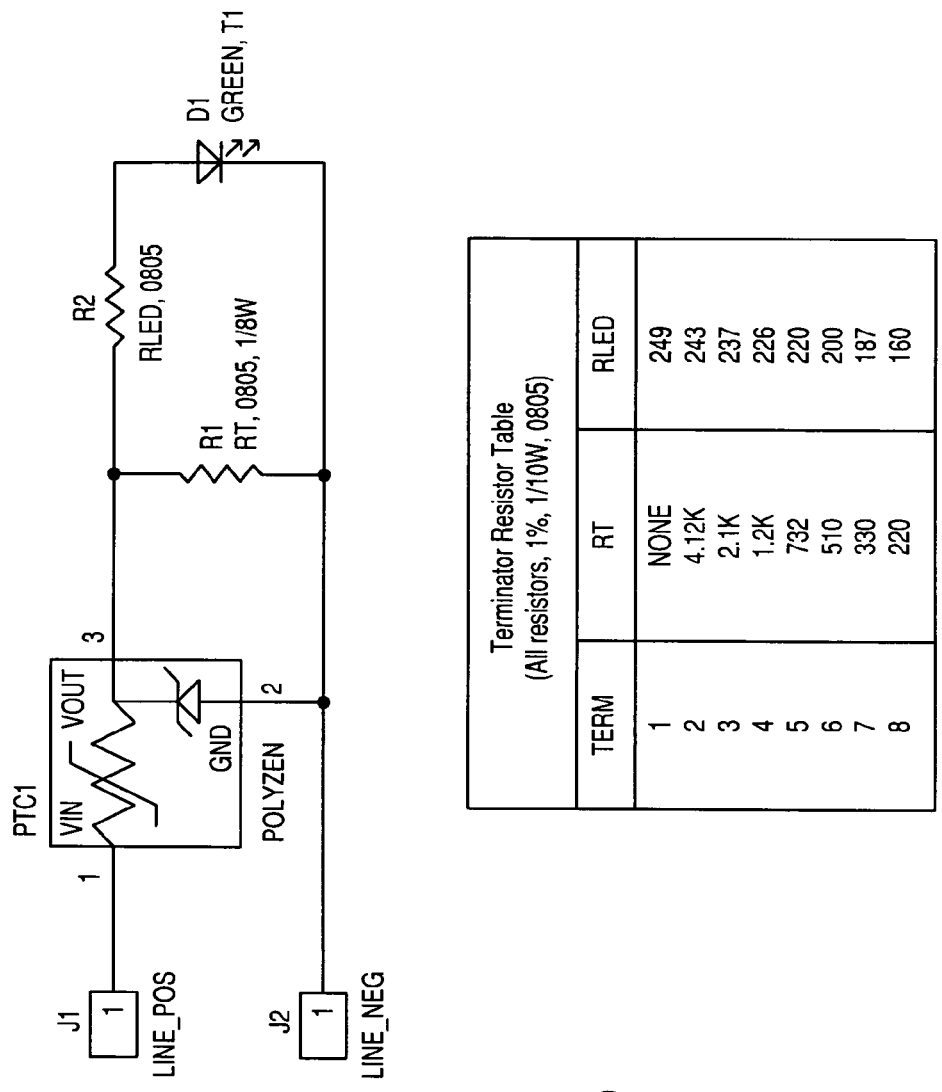
FIG. 59 is a schematic circuit diagram of the end cap of FIG. 53.

The device 610 uses an alternative embodiment of an end cap or terminator 617, which is similar to the end cap 415, except for several features. Referring to FIGS. 56-59, the end cap 617 comprises a cap 618, LED 619, Zener diode and resistors 620, a printed circuit board 621, a pin 622 and a collar 623. A schematic circuit diagram for the end cap 618 is shown in FIG. 59. The LED 619 lights up to indicate the presence of voltage on the test line or continuity when the toner device 610 is connected at the other end of the test line. The end cap 617 is unaffected by extended connection to any low voltage system with voltages, preferably up to about 48V (either polarity) present on the test line, making the device 610 suitable for testing telephone, satellites, security, fire and other systems without damaging the device. Referring to FIG. 58, the end cap 617 has integrated male threaded F-connector, which is more durable than a male push-on F-connector. The threads 634 are held back from the edge 635 to a provide an unthreaded portion 636 for quick testing of female F-connectors without the need to thread them on fully.

Figure 62:
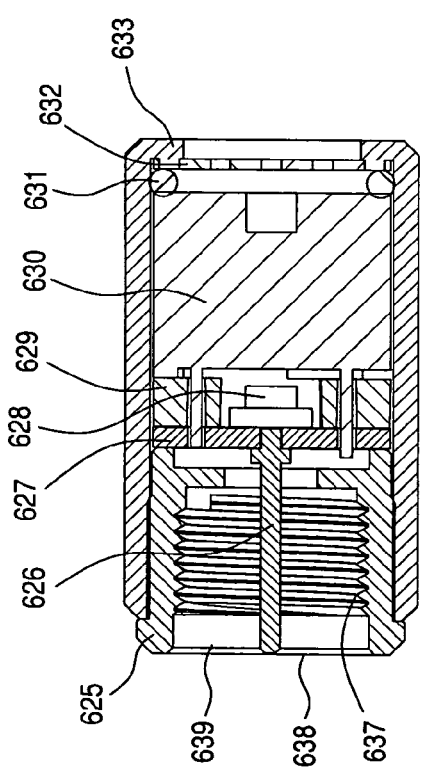
FIG. 62 is a cross-sectional view taken along line 62-62 of FIG. 60.
Figure 63:
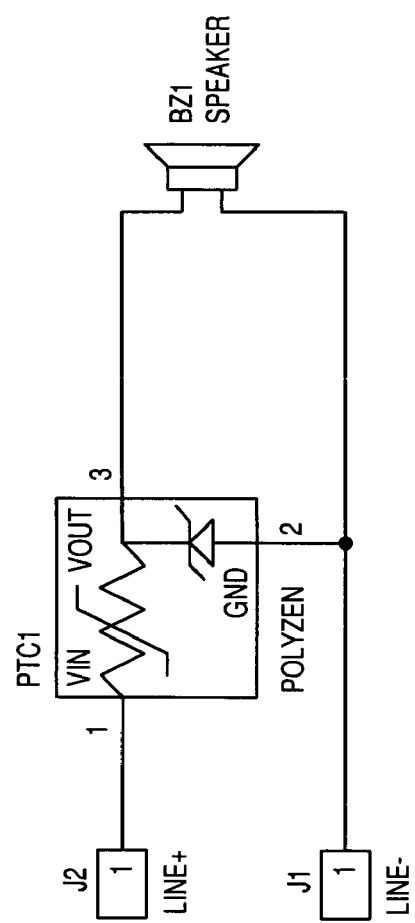
FIG. 63 is a schematic circuit diagram used in the toner of FIG. 60.

The device 610 uses an alternative embodiment of a toner assembly 624 as shown in FIGS. 60-63. The toner assembly 624 comprises a F-port sleeve 625, a pin 626, a printed circuit board 627, a Zener diode 628, a spacer 629, a buzzer 630, an O-ring 631, a screen 632 and a case 633. The buzzer 630 emits a loud tone when connected to the test line with the toner device 610 connected to the end of the line, or when connected to any line with voltages, preferably up to 48V, such as satellite receiver or a telephone line. The toner assembly 624 is unaffected by extended connection to any low voltage system with voltages, preferably up to about 48V (either polarity) present on the test line, making the device 610 suitable for testing telephone, satellites, security, fire and other systems without damaging the device. Referring to FIG. 62, the toner assembly 624 has an integrated male threaded F-connector, which is more durable than a female F-connector. The threads 637 on the sleeve 625 are held back from the end 638 to provide an unthreaded portion 639 to allow quick connection to a female F-connectors without the need to fully thread them on.

Figure 64:
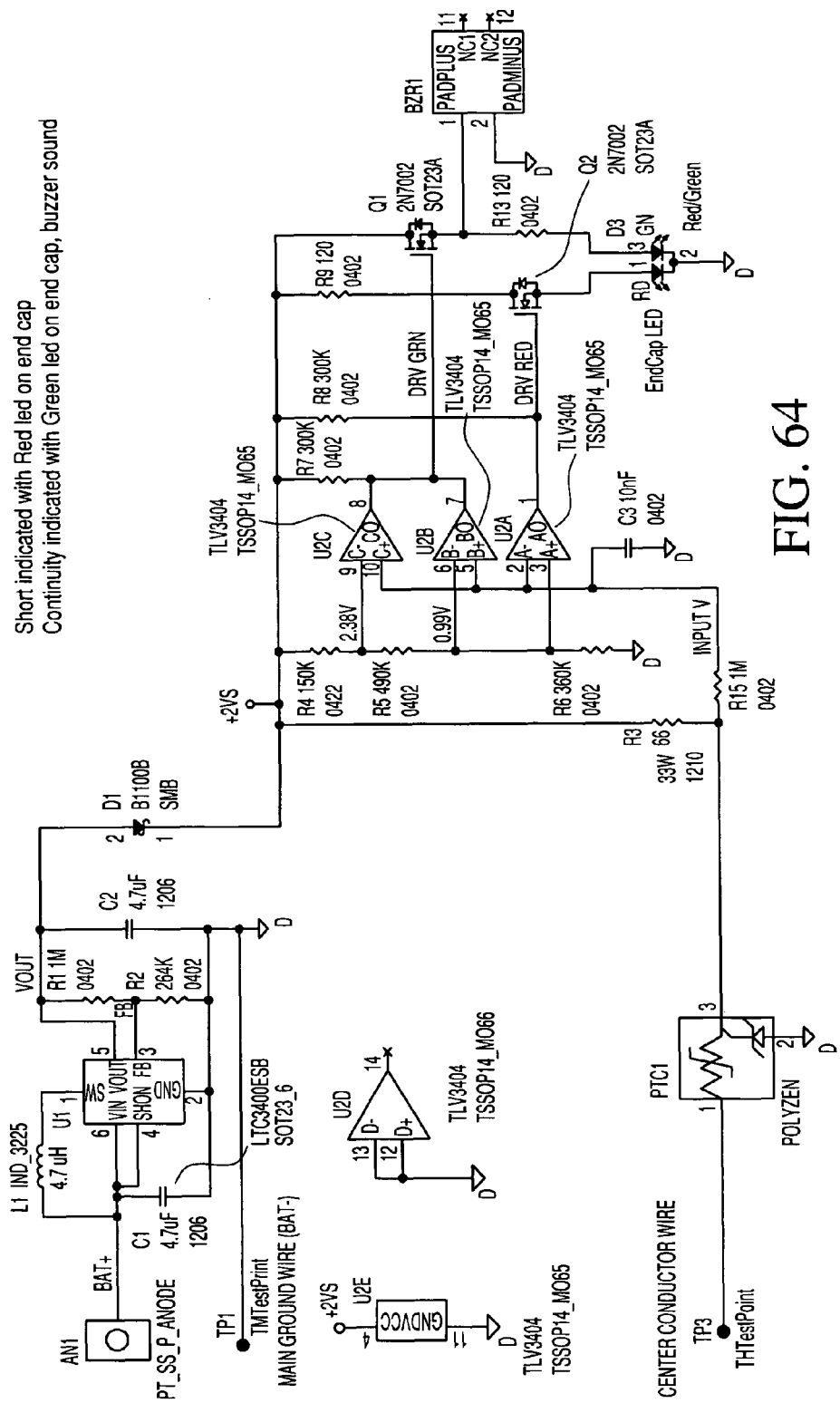
FIG. 64 is a schematic circuit diagram of the printed circuit board used in the pocket toner device of FIG. 1.
Figure 65:
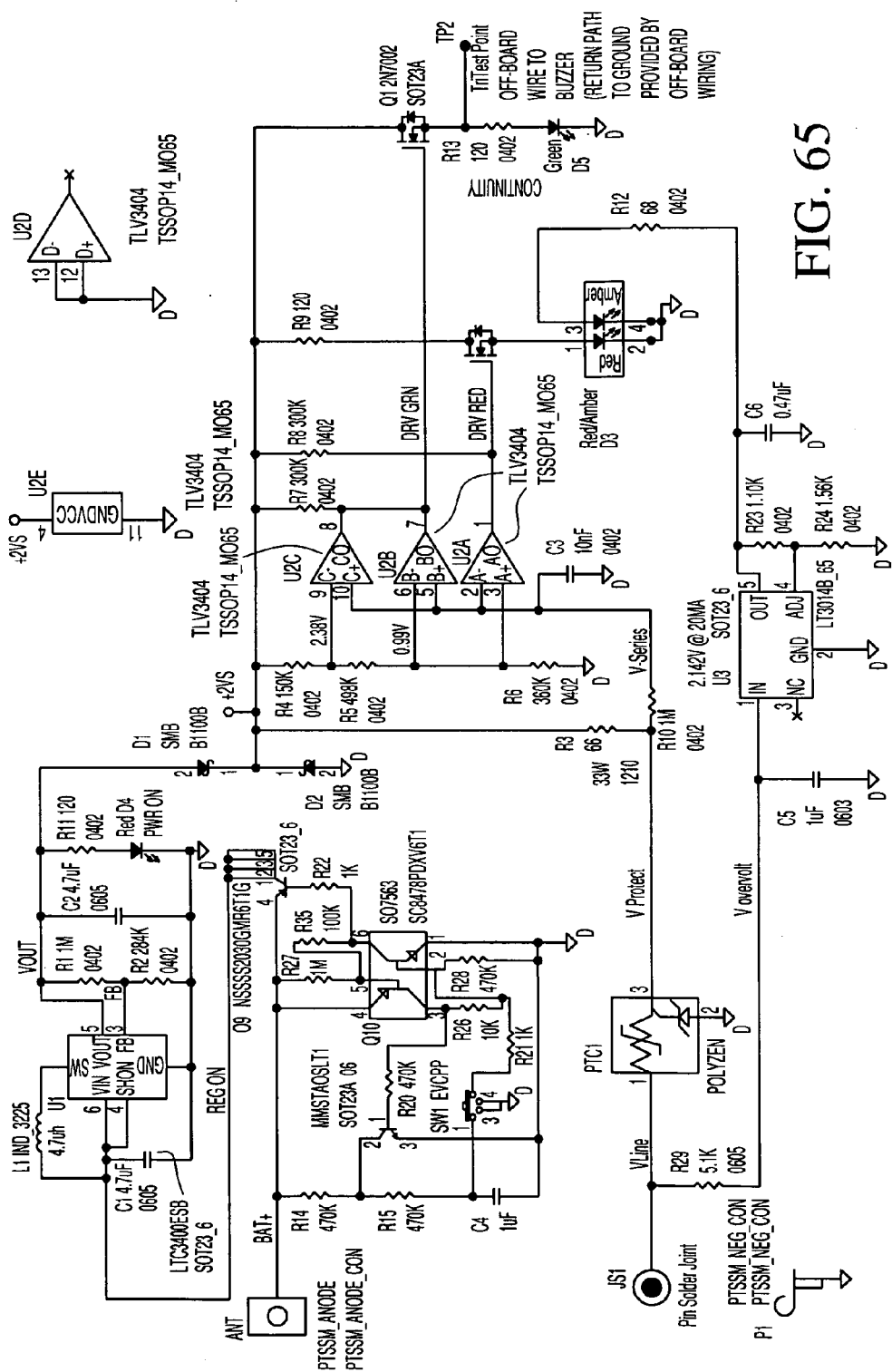
FIG. 65 is a schematic circuit diagram of the printed circuit board used in the pocket toner device of FIG. 26.
Figure 66:
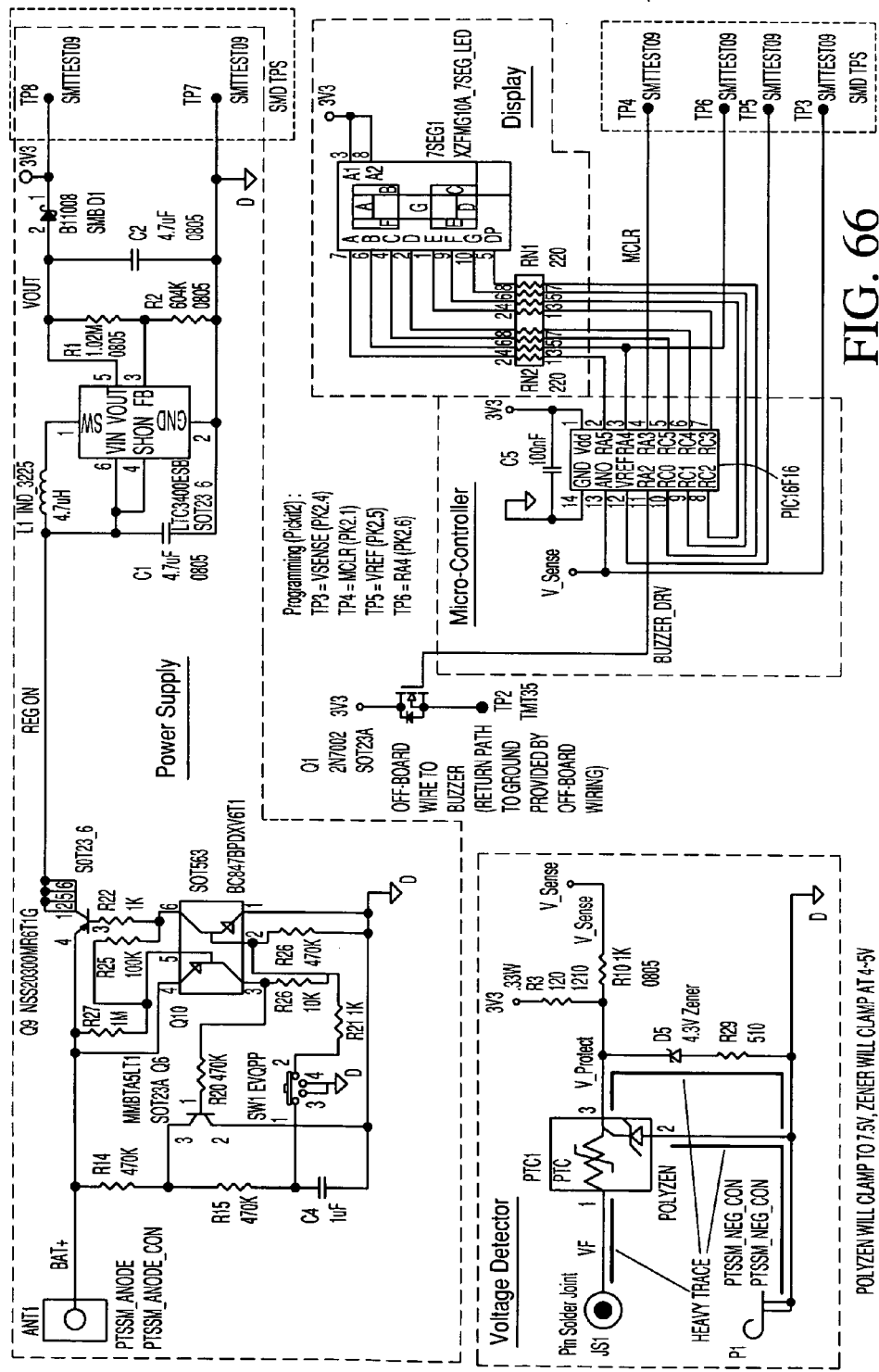
FIG. 66 is a schematic circuit diagram of the printed circuit board used in the pocket toner device of FIGS. 40 and 53.
Figure 67:
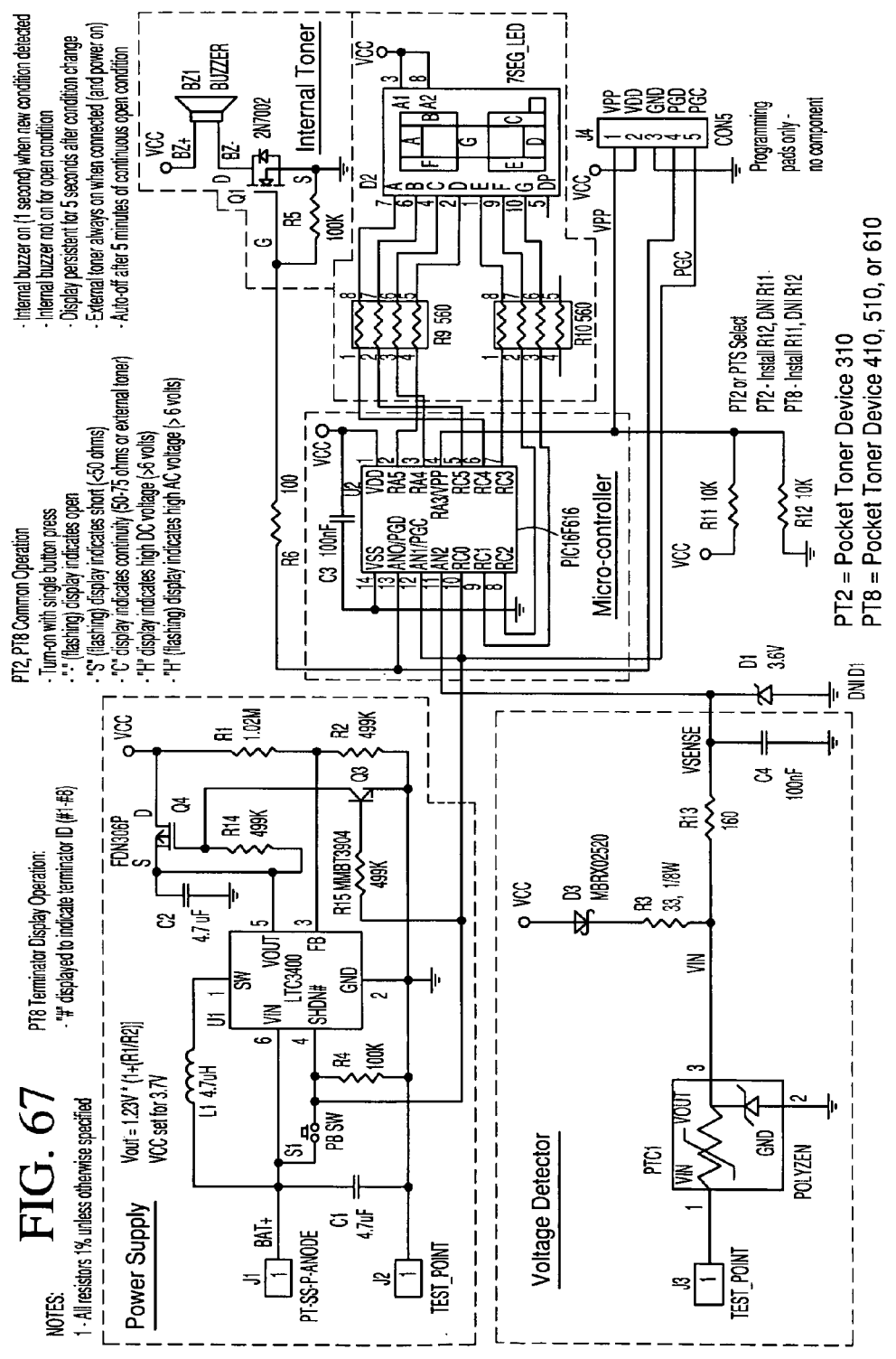

FIG. 64 shows a schematic for the PCB in embodiments 10 and 210. FIG. 65 shows a schematic for the PCB in embodiment 310. FIG. 66 shows a schematic for the main PCB in embodiment 410. These schematics are drawn with standard symbols well known in the art. FIG. 67 show a schematic for the main PCB in embodiment 610. FIG. 68 is a component list common to the pocket toner devices 310, 410, 510 and 610. The operation of the circuit is described below with reference to FIG. 67 and the functional blocks shown therein. However, it should be understood that the description is equally applicable to the other the circuit diagrams.

Power Supply

The power supply block converts the varying AAA battery voltage into a constant circuit supply voltage of 3.7 volts. This voltage is used to power all of the other functional blocks. The 3.7 volts is held constant even as the AAA battery voltage drops from a nominal 1.5 volts to a minimum of 0.85 volts.

This block also incorporates the on/off controls which allow the user to turn the unit on or off with an external push-button press. It also provides an auto-off feature to prevent un-wanted battery drain. When the user presses the momentary contact push-button S1, a high level voltage is applied to the SHDN# pin on U1. This turns on U1 which provides a regulated 3.7 volts on the U1 VOUT pin. To keep the unit turned on when the user releases the push-button, the micro-controller applies a high level voltage to the SHDN# pin on U1. This also turns on Q3 and Q4 which allow current to flow to the rest of the circuit. Q3 and Q4 are required to prevent continuous battery current drain (through L1 and U1) when U1 is turned off.

The same signal that keeps Q3 and Q4 turned on, is used as an analog input to the micro-controller to enable the controller to detect when the user presses the push-button S1. Once turned on, a subsequent user push-button press is detected as a request to turn the unit off. The micro-controller applies a low voltage to the U1 SHDN# pin which turns off the 3.7 volt output.

In a similar fashion, the micro-controller can automatically turn off the unit after a pre-determined time-out period of five minutes of inactivity. This is accomplished by applying a low voltage to the U1 SHDN# pin which turns off the 3.7 volt output.

Voltage Detector

The voltage detector block connects the signal connected to the J3 connection point to the voltage sensing input of the micro-controller.

The sensing voltage is set by the resistive load of the line for normally terminated lines or when an ID terminator is applied. With no load connected, the output voltage at the J3 pin is supplied by the 3.7 volt circuit voltage through the blocking Schottky diode D3 and current limiting resistor R3. With no load (and no output current) there is no voltage drop across R3 and the output voltage equals the 3.7 volts minus the D3 voltage drop which is typically 0.1 to 0.3 volts. When a resistive load connection is applied (between pin J3 and the circuit ground pin J2), current flows through R3 and the external resistive load. The value of this voltage is the 3.7 volts minus the D3 voltage drop and the R3 voltage drop which is a function of the current drawn through the load resistor. This results in varying sense voltages applied to the micro-controller sensing input. The level of the sense voltage is measured to determine the nature of the resistive load.

R3 is required to limit current when a short circuit condition is applied to pin J3 to protect the 3.7 voltage main circuit supply from damage. The sensing voltage with a short circuit condition is close to zero.

PTC1 is a voltage protection device which prevents harmful voltages from reaching the internal circuits. For high voltages applied to pin J3, PTC1 limits the voltage level on the it's output (pin 3) to 5.6 volts. The blocking diode D3 prevents the 5.6 volt signal from reaching the 3.7 volt portion of the circuit but allows the sensing voltage to be detected as a high voltage condition.

AC voltage input is detected as an alternating high voltage condition and low voltage condition at the sense voltage.

The connection point J3 is also used to provide power to an externally connected toner unit. Power for the toner is supplied from the 3.7 volt main circuit voltage through D3 and R3. The external toner is activated as long as it is connected to pin J3.

Micro-Controller

The micro-controller block connects to each of the other operational blocks to provide all of the tool functions.

Connections to the power supply block provide the on/off functions to control the main 3.7 volt circuit voltage.

Connection to the internal toner provides selective control of the internal buzzer depending on the tool connection conditions.

Connection to the display block provide independent control of each of the seven LED segments.

Connection to the voltage detector block provide the sense voltage measurement for accurate detection of the connected line conditions.

Operation of each of the micro-controller functions is implemented in an embedded software program (firmware) in the permanent micro-controller memory. The basic flow of the firmware module is described below.

An external connection point to the micro-controller is provided for programming of the micro-controller during the manufacturing process. This connector is J4 which will connect to standard micro-controller programming systems.

Firmware Operation

The micro-controller firmware implements all of the operating functions of the tool. Basic operation is defined below.

At power-on, the firmware turns on pin RC0 output of the micro-controller (U2) which keeps the power on after the user releases the push-button. Also at power-on, the micro-controller measures the open-circuit sense voltage to adapt for unit-to-unit component variation.

During operation a continuous cycle is followed as defined below:
1. Measure sense voltage at U2 pin AN2
2. Determine the external connection as a function of the sense voltage measurement
3. If the external connection changed, display the appropriate character for the external connection and start a one second activation of the internal toner
4. If an open connection is detected for five seconds, change to the no connection display character
5. If the user presses the on/off push-button, chirp the internal toner and turn off U2 pin RC0 to turn off the unit
6. If still on, start the operational cycle again (Step 1)

Display

The display block provides a visual means of indicating the nature of an external connection applied to the voltage detector block. It is implemented with a green seven-segment LED display. The detected conditions and displayed character are as follows:
   Open Circuit: "-" (flashing), Short Circuit: "S" (flashing)
   50-75Ω Terminated Circuit: "C"
   DC Voltage: "H" or lighting bolt symbol (see below)
   AC Voltage: "H" or lightning bolt symbol (flashing)
   ID Termination: "#" (where # is the number of the connected ID terminator)

The seven-segment LED display is controlled by the micro-controller output pins through a current limiting resistor for each display segment. To extend battery life, the current limiting resistors are sized to provide minimal LED segment current while maintaining adequate brightness for easy visibility.

Since the micro-controller controls each of the LED segments, any character that can be composed with the seven segments can be displayed. This is used for the DC or AC voltage symbol where the upper right and lower left segments of an "H" symbol are turned off to yield a "lightning bolt" symbol.

Once a new connection is detected by the voltage detector block, the displayed character is maintained for 5 seconds after the connection is removed. This allows the user to make the connection in a position where the display is not visible yet still see the connection result after the tool is moved to a more visible location (with an open connection).

A change in connection (other than to an open connection) results in an immediate change in the displayed character.

Internal Toner

The internal toner block provides an audible signal means incorporated inside the body of the tool. BZ1, a piezo-electric buzzer with an internal oscillator, is turned on when Q1 is turned on. This allows the main circuit voltage of 3.7 volts to be applied to the buzzer. Q1 is controlled by an output signal from the micro-controller block.

The internal toner is turned on to indicate that an external connection has been made to the tool voltage detector block. Since it is controllable by the micro-controller, the internal toner is only turned on for a short period of time (nominally one second) as an alert that a new connection has been made and that some indication may be on the display for the user to view. A short duration tone is all that is required for an alert and turning it off extends battery life.

The internal toner also emits a short chirp when the user presses the on/off button to turn the unit off as a means of audible feedback.

It should be understood that each embodiment disclosed herein is not necessarily limited to the features disclosed only for that embodiment. The various features disclosed for each embodiment may be readily incorporated in the other embodiments using ordinary skills of a person skilled in the art.

While this invention has been described in conjunction with the specific embodiments outlined above, it is evident that many alternatives, modifications and variations will be apparent to those skilled in the art. Accordingly, the preferred embodiments of the invention, as set forth above, are intended to be illustrative, not limiting. Various changes may be made without departing from the spirit and scope of this invention.

I claim:

1. An electrical continuity tester for testing the continuity of a cable between one end to another end, comprising:
    a) a main housing having first and second ends;
    b) a first test port disposed at said first end, said first test port for being connected to one end of a cable being tested;
    c) a circuit disposed within said main housing operably connected to said first test port, said circuit including a first indicator for indicating the continuity of a cable being tested;
    d) a coupler removably secured to said main housing; and
    e) a terminator removably secured to said coupler, said terminator for connecting to another end of a cable being tested, said terminator including a second indicator for indicating the continuity of the cable being tested when said first test port is connected to the one end of the cable.

2. An electrical continuity tester as in claim 1, wherein said main housing is longitudinal and pocket-sized.

3. An electrical continuity tester as in claim 1, wherein said first test port is disposed transversely to said main housing.

4. An electrical continuity tester as in claim 1, wherein said first test port is in line with said main housing.

5. An electrical continuity tester as in claim 1, wherein said first test port is an integrated male F-connector.

6. An electrical continuity tester as in claim 5, wherein:
    a) said male F-connector includes collar with inside threads; and
    b) said threads start at a distance from an outside edge of said collar.

7. An electrical continuity tester as in claim 1, wherein said first test port includes a removable F-connector adapter.

8. An electrical continuity tester as in claim 1, wherein said main housing includes a second test port at said second end.

9. An electrical continuity tester as in claim 8, wherein said second test port is a male F-connector.

10. An electrical continuity tester as in claim 8, wherein said first indicator includes a buzzer removably connected to said second test port.

11. An electrical continuity tester as in claim 1, wherein said first indicator includes a LED.

12. An electrical continuity tester as in claim 1, wherein said first indicator includes a buzzer.

13. An electrical continuity tester as in claim 1, wherein said first indicator includes a display.

14. An electrical continuity tester as in claim 1, wherein said second indicator includes a LED.

15. An electrical continuity tester as in claim 1, wherein said second indicator includes a buzzer.

16. An electrical continuity tester as in claim 1, wherein said circuit includes a voltage detector to detect voltage in the cable.

17. An electrical continuity tester as in claim 1, wherein said circuit includes a voltage detector to detect AC or DC voltage in the cable.

18. An electrical continuity tester as in claim 1, wherein:
    a) said terminator includes an indicia; and
    b) said circuit includes an identifier circuit for identifying said terminator having said indicia when said first test port is connected to one end of the cable and said terminator to another end of the cable.

19. An electrical continuity tester as in claim 18, wherein said first indicator includes a display for displaying said indicia.

20. An electrical continuity tester as in claim 18, wherein said terminator includes a resistor corresponding to said indicia.

21. An electrical continuity tester as in claim 1, wherein said circuit includes a power-on indicator.

22. An electrical continuity tester as in claim 1, wherein said circuit includes an indicator for indicating a short in the cable being tested.

23. An electrical continuity tester as in claim 22, wherein said indicator for indicating a short includes a LED disposed at said first end of said main housing.

24. An electrical continuity tester as in claim 1, wherein said circuit includes voltage protection.

25. An electrical continuity tester as in claim 1, wherein said terminator includes voltage protection.

26. An electrical continuity tester as in claim 1, wherein:
    a) said first test port includes a F-connector; and
    b) said coupler includes a F-connector to change a gender of said first test port F-connector.

27. An electrical continuity tester as in claim 26, wherein said coupler is removably secured to said second end.

28. An electrical continuity tester as in claim 26, wherein:
    a) said coupler includes first and second ends having threads; and
    b) said threads start at a distance from an outer edge of each of said first and second ends.

29. An electrical continuity tester as in claim 26, wherein said coupler includes a knurled wheel for turning said coupler.

30. An electrical continuity tester as in claim 26, wherein said threaded first and second ends include female F-connectors.

31. An electrical continuity tester as in claim 1, wherein:
    a) said main housing includes a second test port;
    b) said coupler is electrically connected to said second test port; and
    c) said terminator is electrically connected to said coupler.

32. An electrical continuity tester for testing the continuity of a cable between one end to another end, comprising:
    a) a main housing having first and second ends;
    b) a first test port disposed at said first end, said first test port for being connected to one end of a cable being tested;
    c) a circuit disposed within said main housing operably connected to said first test port, said circuit including a first indicator for indicating the continuity of a cable being tested;
    d) a terminator for connecting to another end of a cable being tested, said terminator including an identifier indicia; and
    e) said circuit including an identifier circuit for identifying said terminator such that when said first test port is connected to one end of the cable, said identifier circuit generates an indicia corresponding to said identifier indicia.

33. An electrical continuity tester as in claim 32, wherein said terminator includes a second indicator for indicating the continuity of the cable being tested when said first test port is connected to the one end of the cable.

34. An electrical continuity tester as in claim 33, wherein said second indicator includes a LED.

35. An electrical continuity tester as in claim 32, wherein said terminator includes a resistor corresponding to said indicia.

36. An electrical continuity tester as in claim 32, wherein said terminator includes voltage protection.

37. An electrical continuity tester as in claim 32, wherein said first indicator includes a buzzer.

38. An electrical continuity tester as in claim 32, wherein said first indicator includes a plurality of LEDs.

39. An electrical continuity tester as in claim 32, wherein said first indicator includes a display for displaying said indicia.

40. An electrical continuity tester as in claim 39, wherein said circuit includes an AC voltage indicator displayed on said display.

41. An electrical continuity tester as in claim 39, wherein said circuit includes a DC voltage indicator displayed on said display.

42. An electrical continuity tester as in claim 39, wherein said circuit includes an open circuit indicator displayed on said display.

43. An electrical continuity tester as in claim 39, wherein said circuit includes an a short circuit indicator displayed on said display.

44. An electrical continuity tester as in claim 39, wherein said circuit includes voltage protection.

* * * * *